United States Patent [19]

Uchimura et al.

[11] Patent Number: 4,704,600

[45] Date of Patent: Nov. 3, 1987

[54] OVERSAMPLING CONVERTER

[75] Inventors: Kuniharu Uchimura; Tsutomu Kobayashi, both of Kanagawa; Atushi Iwata, Tokyo; Toshio Hayashi; Tadakatsu Kumura, both of Kanagawa, all of Japan

[73] Assignee: Nippon Telegraph and Telephone Corporation, Tokyo, Japan

[21] Appl. No.: 826,128

[22] Filed: Feb. 4, 1986

[30] Foreign Application Priority Data

Feb. 4, 1985 [JP] Japan .................................. 60-18506
Feb. 4, 1985 [JP] Japan .................................. 60-18507

[51] Int. Cl.$^4$ ............................................. H03M 3/00
[52] U.S. Cl. ....................... 340/347 AD; 340/347 DA
[58] Field of Search ................. 340/347 AD, 347 NT, 340/347 DA; 332/11 D; 375/27-33

[56] References Cited

U.S. PATENT DOCUMENTS

| | | | |
|---|---|---|---|
| 3,192,371 | 6/1965 | Brahm | 340/347 AD |
| 3,550,004 | 12/1970 | Candy | 340/347 AD |
| 4,301,446 | 11/1981 | Petit | 340/347 NT |
| 4,439,756 | 3/1984 | Shemoi | 340/347 AD |
| 4,588,981 | 5/1986 | Senn | 340/347 AD |

OTHER PUBLICATIONS

IEEE Journal of Solid-State Circuits, Aug. 1981, vol. SC-16, No. 4, T. Misawa, J. E. Iwersen, "Single-Chip per Channel Codec with Filters Utilizing Δ-ΣModulation", pp. 333-341.

Primary Examiner—Charles D. Miller
Attorney, Agent, or Firm—Blakely, Sokoloff Taylor & Zafman

[57] ABSTRACT

An oversampling converter includes first and second integrators for integrating a difference between an input terminal voltage and feedback voltages, first and second quantizers for quantizing outputs from the first and second integrators, respectively, first and second feedback paths for feeding back as the feedback voltages outputs from the first quantizer to the input sides of the first and second integrators, a differentiator arranged at an output side of the second quantizer, an adder for adding an output from the differentiator and the output from the first quantizer, and a circuit for supplying an output from the first integrator to an input terminal of the second integrator. Two or more quantization loops may be used. When the oversampling converter is used as an A/D converter, A/D converters are arranged in the first and second feedback paths. When the oversampling converter is used as a D/A converter, D/A converters are arranged between the adder and the first quantizer and between the adder and the second quantizer.

12 Claims, 33 Drawing Figures

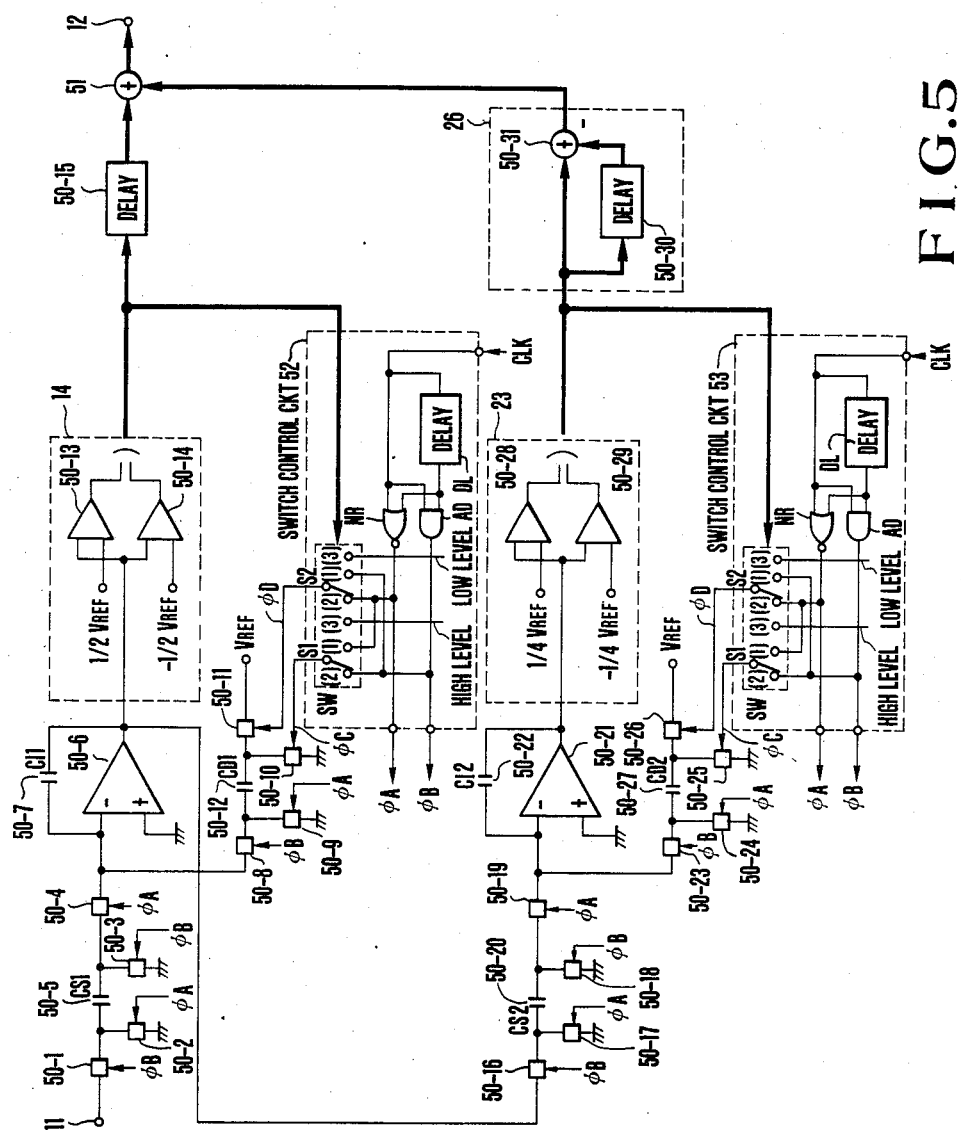
F I G. 5

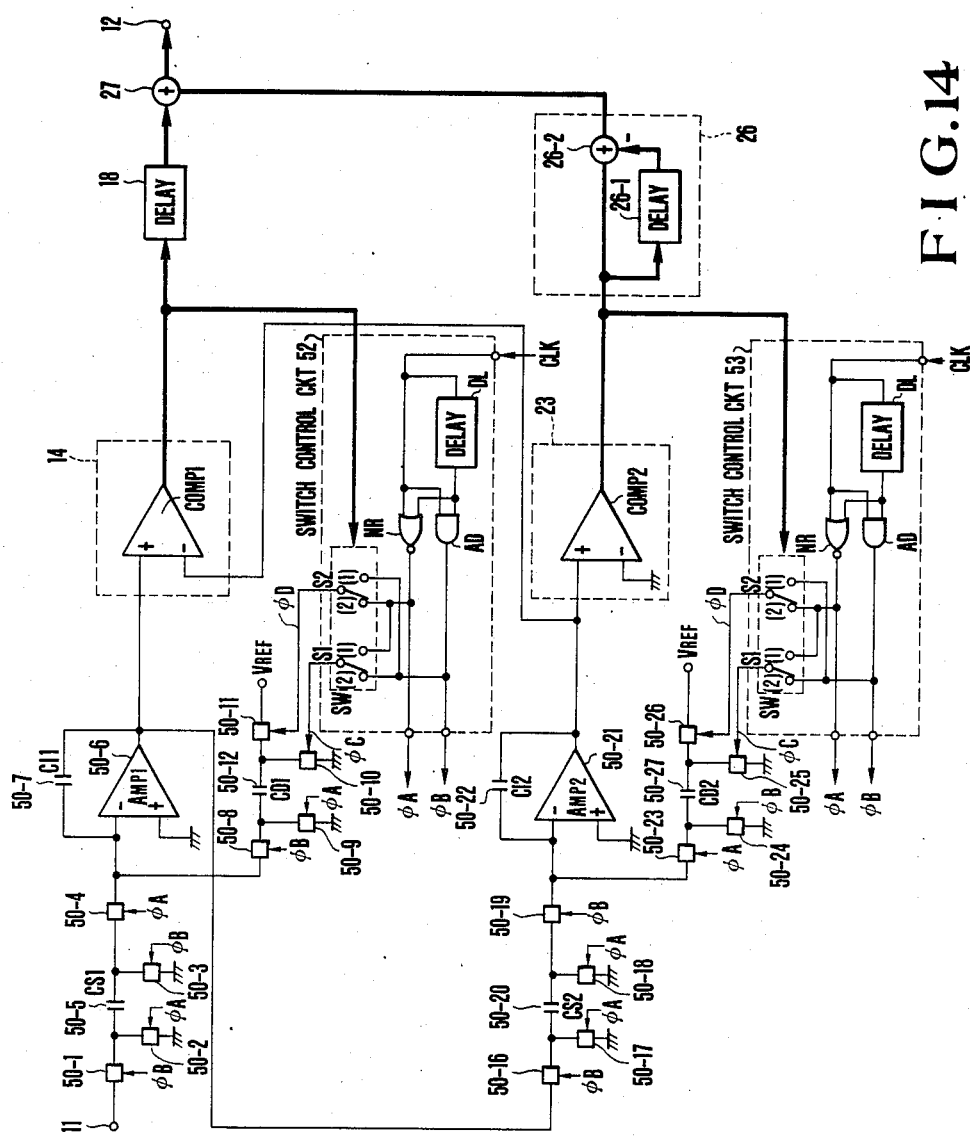
F I G. 14

OVERSAMPLING CONVERTER

BACKGROUND OF THE INVENTION

The present invention relates to an oversampling converter for performing A/D or D/A conversion at a clock frequency much higher than a signal frequency.

It is generally known that an original signal can be reproduced according to the Nyquist's theorem at a sampling frequency ($f_S$), which is set to be about twice a signal frequency bandwidth ($f_{BD}$) when an analog signal is sampled or a sampled digital signal is converted to an analog signal. In other words, the sampling frequency ($f_S$) of general A/D or D/A converters is selected to be about twice the signal frequency bandwidth ($f_{BW}$).

In a conventional oversampling A/D or D/A converter, its sampling frequency ($f_S$) is set to be higher than twice the signal frequency bandwidth ($f_{BW}$), to improve conversion precision.

For example, a conversion error of an A/D converter occurs when a sampled analog signal is quantized to a digital signal. This quantization error is the difference between an input voltage and a quantized voltage of a quantizer, and is given as a random value falling within an amplitude range of $\pm V_q/2$ with respect to a minimum quantized step voltage ($V_q$). For this reason, the frequency spectrum of quantization noise generated by quantization errors is uniformly distributed within a bandwidth $f_S/2$.

Because the total of quantization noise power is determined by the noise amplitude, the higher the sampling frequency ($f_S$) is, the lower the level of each spectrum is, due to dispersion of noise over a wide range. For example, if quantization noise of 16 KHz or more is filtered out at a signal frequency bandwidth $f_{BW}$ of 16 KHz and a sampling frequency $f_S$ of 2048 KHz, residual quantization noise power in the signal bandwidth is decreased to $2 \cdot f_{BW}/f_S = 1/64$.

When oversampling is performed at a frequency which is 64 times the sampling frequency ($f_S$), the quantization noise power is decreased to 1/64, so that the S/N ratio can be increased by about 18 dB. This increase in S/N ratio corresponds with the fact that a quantization resolution of the A/D converter is increased by eight times (i.e., 3 bits).

A typical conventional oversampling A/D converter is exemplified by a delta-sigma oversampling A/D converter. The delta-sigma oversampling A/D converters are divided into two types: single integration type converter and a double integration type converter. A single integration type converter is described in IEEE Journal of Solid-State Circuits, August 1981, Vol.-SC-16 No. 4, T. Misawa & J. E. Iwersen, "Single-Chip per Channel Codec with Filters Utilizing Δ-Σ Modulation" PP. 333-341. This codec has a single integrator, a quantizer for quantizing an output from the integrator, and a negative feedback path for feeding back an output from the quantizer to an input terminal of the integrator. Typical examples of such codecs are shown in FIG. 20A (an A/D converter) and FIG. 20B (a D/A converter).

Referring to FIGS. 20A and 20B, reference numeral 1 denotes a signal input terminal; 2, a signal output terminal; 3, a quantizer; 4, a digital-to-analog converter (to be referred to as a D/A converter hereinafter); 5, an integrator circuit; 5-1, an integrator constituting the integrator circuit; 6, an adder; and 7, a delay circuit inserted between the output terminal of the quantizer 3 and the D/A converter 4. In the circuits in FIGS. 20A and 20B, the integrator circuit 5 distributes a majority of quantization noise components in the high-frequency range, the noise level being low in the low frequency range and high in the high-frequency range. Therefore, the S/N ratio is higher than that in the method of simply increasing the sampling frequency ($f_S$).

With the above arrangement, a quantizer output $V_{OUT}$ appearing at the output side 2 of the quantizer 3 is given by the following equation:

$$V_{OUT} = V_{IN} \cdot H_1/(1 + Z^{-1} \cdot H_1) + V_{QN}/(1 + Z^{-1} \cdot H_1) \qquad (1)$$

where $V_{IN}$ is the input signal supplied to the input terminal 1, $H_1$ is the transfer function or gain of the integrator, $V_q$ is the quantization noise, $Z^{-1} = e^{j\omega T}$, $\omega = 2\pi f$, $T = 1/f_S$, and $f_S$ is the sampling frequency.

A signal component of the first term of equation (1) is $H_1/(1 + Z^{-1} \cdot H_1) \simeq 1$ and has substantially flat frequency characteristics. A signal component of the second term defined as $V_{TN}$ is associated with quantization noise and is given as $H_1 = 1/(1 - Z^{-1})$, so that $$V_{TN} = V_{qN} \cdot (1 - Z^{-1}) \qquad (1')$$

The equivalent characteristic $(1 - Z^{-1})$ is given as $$(1 - Z^{-1}) = 1 - e^{-j\omega T} = 2 \sin(\pi f/f_S)$$

This noise is found to be suppressed when its frequency is decreased through the transfer function $H_1$ of the integrator. With this arrangement, when only a signal of the signal bandwidth is extracted by a low-pass filter, a signal with a high S/N ratio can be obtained.

In order to convert the obtained digital signal to an analog signal again, a D/A converter 4 is used. Conversion precision of the D/A converter 4 is determined by resolution and linearity. In general, a reference voltage is divided by resistor or capacitor elements in accordance with an input signal to generate an ouput voltage. It is possible to improve the resolution by increasing the number of elements. However, when each output voltage is not accurately linear, a decoded analog voltage is inevitably distorted, analog output linearity depends on the precision of elements constituting the D/A converter, so in order to obtain a high-precision D/A converter, a large number of high-precision elements are required therein.

Conversely, the accurate output analog voltage can be obtained at a low resolution with a binary output (one-bit resolution) and a ternary output (2-bit resolution) without using a plurality of elements. In this case, high-precision linearity can be obtained irrespective of precision of the elements. Since any two points given by binary outputs are plotted on a line, substantially no problems with linearity occur. For ternary outputs, a positive or negative reference voltage is charged by or not charged by a single capacitor element to obtain three voltages of good linearity. Since linearity of a D/A converter with a low resolution of 1 to 2 bits can be quaranteed, high conversion precision can be achieved only if a conversion error occurring at low resolution is decreased.

To achieve this, a D/A converter with a one-bit resolution is used. The basic arrangement of such a D/A converter is given as follows: An input signal is supplied to an integrator, and an output therefrom is quantized by a quantizer, and is then converted by a D/A converter to an analog signal. In this case, the output from the quantizer is negatively fed back to the input side of the integrator, thereby decreasing noise.

In order to obtain higher conversion precision than the single integration type delta-sigma oversampling converter, a double integration type delta-sigma oversampling converter has been proposed. A typical example of this type of converter is described in U.S. Pat. No. 4,439,756. Double integration type delta-sigma converters are exemplified in FIG. 21A (an A/D converter) and FIG. 21B (a D/A converter). With the given arrangements, when a transfer function of an additional integrator is given as $H_2$, and other arrangements are the same as those of the single integration type converter in FIG. 20A, B, a quantized output $V_{OUT}$ is given as follows:

$$V_{OUT} = V_{IN} \cdot H_1 \cdot H_2/(1 + Z^{-1} \cdot H_1 \cdot H_2 + Z^{-1} \cdot H_2) + V_q/(1 + Z^{-1} \cdot H_1 \cdot H_2 + Z^{-1} \cdot H_2) \qquad (2)$$

The second term; total noise of converter, $V_{TN}$ is given:

$$V_{TN} = V_{qN} \cdot (1 - Z^{-1})^2 \qquad (2')$$

for $H_1 = H_2 = 1/(1 - Z^{-1})$.

As is apparent from the second term in equation (2), the noise components of the quantizer are greatly decreased from those of the single integration type delta-sigma converter.

A converter for improving an S/N ratio by changing the noise frequency distribution characteristics is called a noise shaping type converter. More particularly, in the converters in FIGS. 20A and 20B, if $f_{BW} = 16$ kHz and $f_S = 2048$ kHz, the noise level within the bandwidth is attenuated by about 31 dB in accordance with equation (1'). In addition to an increase (i.e., 18 dB) in S/N ratio due to dispersion of quantization noise components over a wide range, as described above, a total increase in S/N ratio in the circuits of FIGS. 20A and 20B can be about 49 dB.

In the circuit arrangements in FIGS. 20A and 20B and FIGS. 21A and 21B, the integrators 5-1, 5-2, and 5-4 are normally constituted by operational amplifiers which have an operation speed lower than that of the quantizer 3 and the D/A converter 4. For this reason, the operation speed of the integrators substantially determines the upper limit of the sampling frequency ($f_S$). Each arrangement in FIGS. 21A and 21B has two integrators connected in series and requires processing time twice that of the arrangements in FIGS. 20A and 20B, so that the upper limit of the sampling frequency ($f_S$) is about ½ that of the FIG. 2 or 20. Even if the S/N ratio is increased by a series circuit of integrators, the total effect is not increased much.

More specifically, when an increase in S/N ratio in each arrangement of FIGS. 21A and 21B at $f_{BW} = 16$ kHz and $f_S = 1024$ kHz is calculated, an S/N ratio increase component by dispersion of the quantization noise components over the wide range is about 15 dB, and an S/N ratio increase component by noise shaping is about 47 dB according to equation (2'), the total increase in S/N ratio is 62 dB. Since the increase in S/N ratio in each arrangement in FIGS. 20A and 20B is only 49 dB, the S/N ratio of each arrangement in FIGS. 21A and 21B is increased thereover by 13 dB.

If a resolution of the quantizer is $N_q$ bits and a signal voltage range is ±1 V, an average value of a square $V_{qN}^2$ of the quantization error is $(2^{2-N_q})^2/12$, and an average voltage of a sinusoidal wave of peak level is $1/\sqrt{2}$. Therefore, its S/N ratio is given as $10 \log (6/(2^{2-N_q})^2)$ (dB). The S/N ratio of only the quantizer is given as $6 \times (N_q - 1) + 1.8$ (dB). In the arrangement of FIG. 21B, an increase in S/N ratio is 62 dB ($f_{BW} = 16$ kHz and $f_S = 1024$ kHz). When the quantizer has a 2-bit resolution (ternary output for the D/A converter), an S/N ratio is 69.8 dB, as a sum of 7.8 dB of the quantizer and the already improved 62 dB.

However, when the additional integrator is used, the possibility of loop oscillation is high. In order to quarantee operation stability, a phase lead bypath must be arranged. When a triple or more integration type converter is used, loop oscillation inevitably occurs.

In addition, when at least two integrators are cascade-connected to constitute a feedback loop, processing time is at least doubled, and the sampling frequency is decreased. With such an arrangement, when an input signal level is high, the loop becomes unstable. As a result, the S/N ratio is decreased.

On the contrary, in order to obtain a high integrator gain with a single integrator, an amplifier with a high gain is required. In this case, wide bandwidth cannot be used, and the sampling frequency ($f_S$) cannot be increased.

In short, when the number of integrators is increased, high conversion precision cannot be obtained in conventional delta-sigma oversampling converters.

SUMMARY OF THE INVENTION

It is, therefore, a principal object of the present invention to provide an oversampling converter with higher conversion precision than that of conventional oversampling converters.

It is another object of the present invention to provide a low-cost, compact (small chip area) oversampling converter which achieves the principal object described above.

It is still another object of the present invention to provide an oversampling converter which can sufficiently supress quantization noise, even if multiple integration is performed.

It is still another object of the present invention to provide an oversampling converter using a high sampling frequency, which achieves in addition to the above-mentioned objects.

It is still another object of the present invention to provide an oversampling converter which has high loop stability and a high S/N ratio assured against a high input signal level.

In order to achieve the above objects of the present invention, there is provided an oversampling converter with sampling frequency sufficiently higher than an input signal frequency, comprising: N quantization loops (N is an integer of not less than 2), each having an integrator for integrating a difference between an input terminal signal and a feedback signal, a quantizer for quantizing an output from the integrator, means for converting an output from the quantizer to the feedback signal, means for detecting a quantization error generated by the quantizer, and means for converting the output from the quantizer to a loop output signal; a first quantization loop for producing a first loop output signal from the input terminal signal; an nth quantization loop (n is an integer between 2 and N), having the same arrangement as the first quantization loop, for receiving at input terminals a quantization error from an (n−1)th quantization loop and for producing an nth output signal; and multiplying and adding means for adding the signal obtained by multiplying the nth loop output signal with a transfer function of a reciprocal number of a product of transfer functions of the integrators included in the first to (n−1)th quantization loop, to the first loop output signal and for generating a sum signal, the sum signal appearing as an output signal.

BRIEF DESCRIPTION OF THE DRAWINGS

FIG. 5 is a circuit diagram showing the detailed arrangement of the converter in FIG. 4;

FIG. 14 is a block diagram showing a modification of FIG. 10;

DESCRIPTION OF THE PREFERRED EMBODIMENTS

Preferred embodiments of the present invention will be described in detail with reference to the accompanying drawings.

Figure 1:
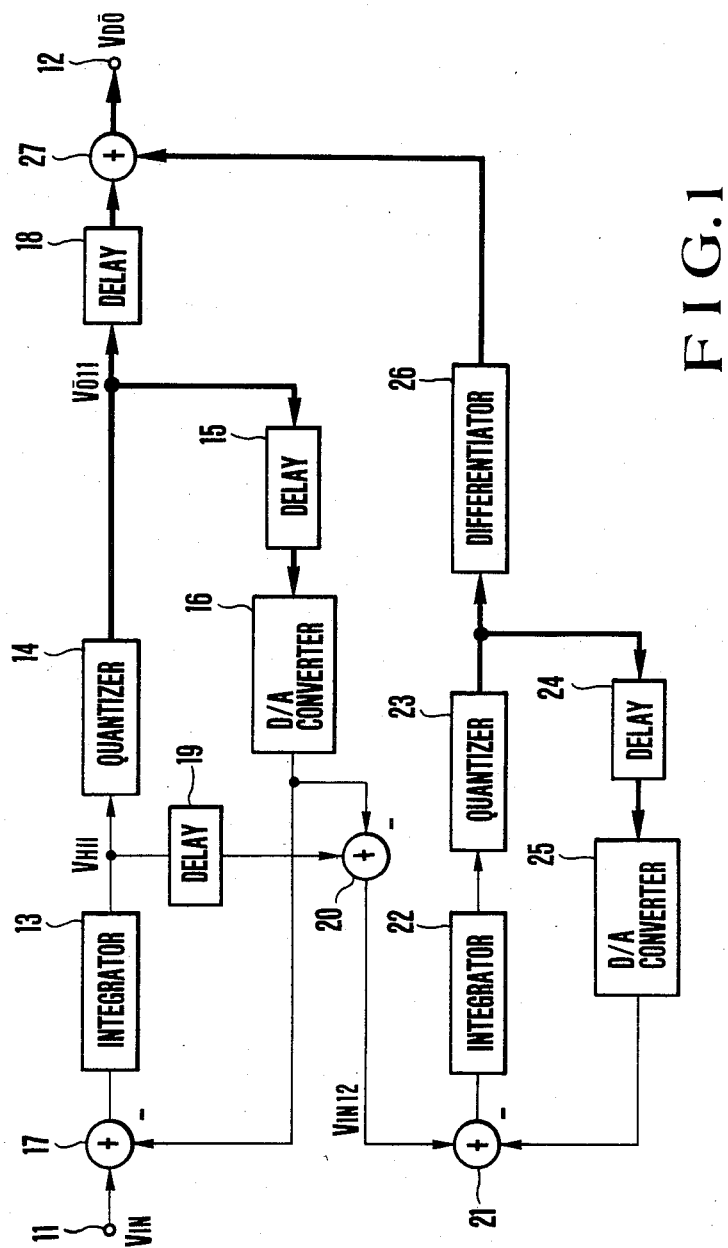
FIG. 1 is a block diagram of an oversampling A/D converter according to an embodiment of the present invention.

FIG. 1 shows an oversampling A/D converter according to an embodiment of the present invention. This converter includes two loops, each of which includes an integrator and an integrator and a quantizer.

Referring to FIG. 1, reference numeral 11 denotes a signal input terminal; 12, a signal output terminal; 13, an integrator for integrating a difference between the input terminal voltage and the feedback voltage; 14, a quantizer for quantizing an output voltage from the integrator 13 to a digital signal; 15, a delay circuit for receiving an output from the quantizer 14; 16, a D/A converter for receiving an output from the delay circuit 15 and converting the digital signal to an analog voltage signal; and 17, an adder for receiving the input terminal voltage $V_{IN}$ from the signal input terminal 11 and the feedback voltage from the D/A converter 16 and generating a difference therebetween, i.e., negatively feeding back the difference to the input side of the integrator 13. Reference numeral 18 denotes a delay circuit for receiving the output from the quantizer 14 and the output signals from 15 and 18 are same; and 19, a delay circuit for receiving the output from the integrator 13. An output from the delay circuit 19 and the output from the D/A converter 16 are respectively supplied to an adder 20.

Reference numeral 21 denotes an adder for receiving an output from the adder 20 and an output from a D/A converter 25; 22, an integrator for integrating an output from the adder 21; 23, a quantizer for digitizing an output voltage from the integrator 22 to a digital signal; 24, a delay circuit for receiving the digital output signal from the quantizer 23; 25, the D/A converter for converting the digital output signal from the delay circuit 24 to an analog voltage signal; 26, a differentiator for differentiating an output from the quantizer 23; and 27, an adder for adding an output from the differentiator 26 and an output from the delay circuit 18, and supplying the sum as a digital output signal to the signal output terminal 12. Thin lines in the drawing are analog signal lines and thick lines are digital signal lines.

The integrators 13 and 22 have a larger gain when an input signal frequency is lower. Transfer functions of the integrators 13 and 22 are given as $H_{11}$ and $H_{12}$. The differentiator 26 has an inverted characteristic to that of the integrator 13. Its inverted transfer function is given as $1/H_{13}$.

In the embodiment shown in FIG. 1, the integrator 13, the quantizer 14, the delay circuit 15, the D/A converter 16, and the adder 17 constitute a first loop, and the integrator 22, the quantizer 23, the delay circuit 24, the D/A converter 25 and the adder 21 constitute a second loop, and an output from the delay circuit 18 is the first loop output and an output from the quantizer 23 is the 2nd loop output.

The operation of the oversampling A/D converter shown in FIG. 1 will no be described.

A difference between the outputs from the integrator 13 and the D/A converter 16 is calculated by the adder 20 as a quantization error in the first loop. The difference signal is supplied as an input signal to the second loop. The output from the first-loop quantizer 14 is added by the adder 27 to a signal obtained by differentiating the output from the second-loop quantizer 23 by the differentiator 26, thereby obtaining a digital output signal. With this arrangement, main conversion errors included in the digital ourpur signal are quantization errors generated by the quantizers 14 and 23. The quantization error voltages from the quantizers 14 and 23 are given as $V_{qN11}$ and $V_{qN12}$.

If the output from the first-loop quantizer 14 is $V_{O11}$ and the output from the integrator 13 is $V_{H11}$, they are derived as follows:

$$V_{\overline{O}11} = V_{IN} \cdot H_{11}/(1+Z^{-1} \cdot H_{11}) + V_{qN11}/(1+Z^{-1} \cdot H_{11}) \quad (3)$$

$$V_{H11} = V_{IN} \cdot H_{11}/(1+Z^{-1} \cdot H_{11}) - V_{qN11} \cdot Z^{-1} \cdot H/(1+Z^{-1} \cdot H_{11}) \quad (4)$$

When a second-loop input signal is given as $V_{IN12}$, equations (3) and (4) yield equation (5) below:

$$V_{IN12} = (V_{11} - V_{\overline{O}11}) = -V_{qN11} \quad (5)$$

An error component $V_{\overline{O}11}$ given by equation (3) is equal to the error of the conventional circuit which is calculated by equation (1). Equation (5) indicates that only a quantization error voltage $V_{qN11}$ from the quantizer 14 is detected by calculating the difference between $V_{\overline{O}11}$ and $V_{H11}$. It is that the difference between $V_{\overline{O}11}$ and $V_{H11}$ can be used as a quantization error in the 1st quantization loop.

A digital output signal $V_{D\overline{O}}$ appearing at the signal output terminal 12 is calculated by equation (6) below:

$$V_{D\overline{O}} = V_{IN} \cdot H_{11}/(1 + Z^{-1} \cdot H_{11}) + V_{qN11}(H_{13} - H_{12} + Z^{-1} \cdot H_{12} \cdot H_{13} - Z^{-1} \cdot H_{11} \cdot H_{12})/\{(1 + Z^{-1} \cdot H_{11}) \cdot (1 + Z^{-1} \cdot H_{12})H_{13}\} + V_{qN12}\{1/(1 + Z^{-1} \cdot H_{12})H_{13}\} \quad (6)$$

The term $V_{qN11}$ is completely eliminated from equation (6) if $H_{11} = H_{12} = H_{13}$, thus obtaining equation (7) below:

$$V_{D\overline{O}} = V_{IN} \cdot H_{11}/(1+Z^{-1} \cdot H_{11}) + V_{qN12}/(1+Z^{-1} \cdot H_{12}) \cdot H_{13} \quad (7)$$

If $H_{11} = H_{12} = H_{13} = 1/(1-Z^{-1})$, the noise component in equation (7) is given as equation (8) below:

$$V_{TN} = V_{qN12} \cdot (1-Z^{-1})^2 \quad (8)$$

As is apparent from equation (8), the level of noise voltage appearing at the signal output terminal 12 is low in a low frequency range, and high in a high frequency range. Therefore, the oversampling A/D converter of this embodiment has an improved S/N ratio in the same manner as in the conventional double integral delta-sigma converter of FIGS. 21A or 21B. A magnitude of the quantization error voltage $V_{qN12}$ is proportional to a second-loop maximum input amplitude when a resolution of the quantizer 23 is predetermined. The second-loop input $V_{IN2}$ is the first-loop quantization error voltage, as seen in equation (5), and is determined by the resolution of the first-loop quantizer 14.

If the range of the signal voltage $V_{IN}$ applied to the signal input terminal 11 is normalized to be $\pm 1$ V and the quantizers 14 and 23 have resolutions of $N_{q11}$ and $N_{q12}$ bits, the amplitude voltage ranges of the quantization error voltages $V_{qN11}$ and $V_{qN12}$ are respectively represented by inequalities (9) and (10) below:

$$-2^{-(Nq11-1)} \leq V_{qN11} \leq 2^{-(Nq11-1)} - \quad (9)$$

-continued
$$2^{-(Nq11-1)} \cdot 2^{-(Nq12-1)} \leq V_{qN12}$$
$$\leq 2^{-(Nq11-1)} \cdot 2^{-(Nq12-1)} \quad (10)$$

The conventional amplitude voltage range of $V_{qN}$ is the same as that of $V_{qN11}$. Linearity of the D/A converter (16, 25) is guaranteed independently of the precision of elements used in it when its resolution is only 1 to 2 bits. The resolution of the D/A converter is the same as that of the quantizer and this is normally 1 to 2 bits. When the resolution is 1 bit, as given by equations (9) and (10), $V_{qN11}$ and $V_{qN12}$ fall within the amplitude voltage ranges of $\pm 1$ V. When the quantizer has a 2-bit resolution, $V_{qN11}$ falls within an amplitude voltage range of $\pm 0.5$ V and $V_{qN12}$ falls within an amplitude voltage range of $\pm 0.25$ V. The relationship between the quantizer resolution and $V_q$ in equation (2) of the conventional circuit can be given in the same manner as in equation (9). When the amplitude voltage range of $V_q$ in equation (2) is compared with the amplitude voltage range of $V_{qN12}$, the quantizer resolution is given to be 1 bit, and $V_q$ and $V_{qN12}$ are the same as those of the conventional converters. However, when the quantizer resolution is given to be 2 bits, $V_{qN12}$ is decreased to $\frac{1}{2}$ of $V_q$. When the quantizer resolution is further increased, $V_{qN12}$ is further decreased.

The second-loop input signal $V_{IN12}$ is derived by equation (5). However, according to equation (4), an approximation is given such that $V_{H11} = V_{IN} - V_{qN11}$ in the low frequency range since $H_{11} \gg 1$. The quantization noise component is given in the same manner as in equation (5), and the input signal component does not serve as noise. Therefore, the integrator output $V_{H11}$ can be used as $V_{IN12}$ to obtain the same operation as described above. It is that $V_{H11}$ can be used as the quantization error in the first quantization loop.

The embodiment shown in FIG. 1 exemplifies an oversampling A/D converter constituted by two loops, each of which includes an integrator and a quantizer. However, the oversampling A/D converter may be constituted by three or more loops.

Figure 2:
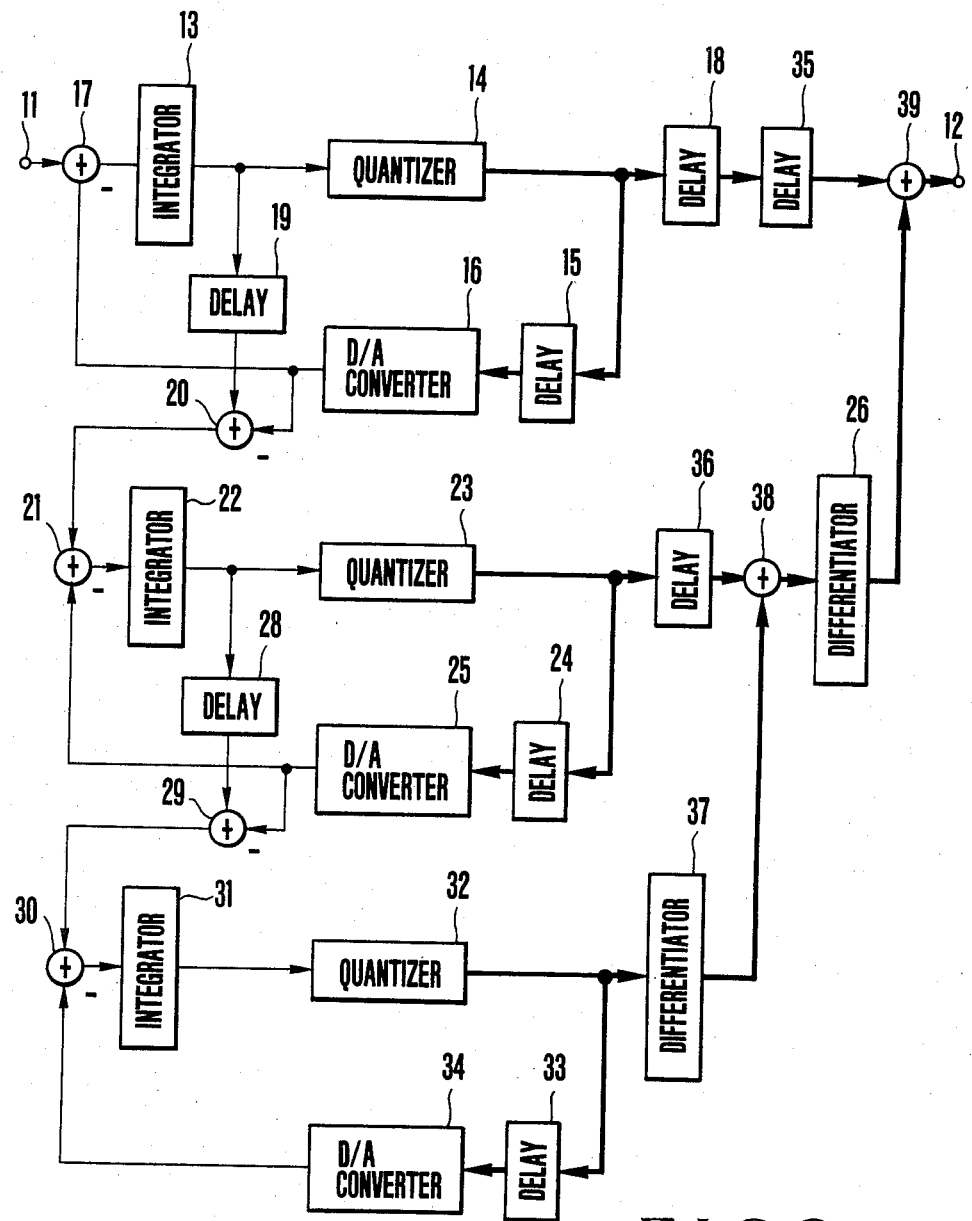
FIG. 2 is a block diagram showing an oversampling A/D converter according to another embodiment of the present invention.

FIG. 2 shows an oversampling A/D converter constituted by three loops according to another embodiment of the present invention.

The same reference numerals in FIG. 2 denote the same parts as in FIG. 1. In addition, reference numeral 28 denotes a delay circuit for receiving an output from an integrator 22; 29, an adder for adding an output from the delay circuit 28 and an output from a D/A converter 25; 30, an adder for adding an output from the adder 29 and an output from a D/A converter 34; 31, an integrator with a transfer function $H_{14}$ for integrating an output from the adder 30; 32, a quantizer with a quantization noise $V_{qN13}$ for quantizing an output from the integrator 31 to a digital signal; 33, a delay circuit for receiving an output from the quantizer 32; 34, the D/A converter for receiving an output from the delay circuit 33, converting the digital signal from the quantizer 32 to an analog voltage signal, and supplying the analog output to the adder 30; 35, a delay circuit for receiving the output from the delay circuit 18; 36, a delay circuit for receiving the output from the quantizer 23; 37, a differentiator with a transfer function $1/H_{15}$ for differentiating the output from the quantizer 32; 38, an adder for adding the output supplied from the quantizer 23 through the delay circuit 36 and the output supplied from the quantizer 32 through the differentiator 37; and 39, an adder for adding the output supplied from the quantizer 14 through the delay circuits 18 and 35 and the output generated by the adder 38 through the differentiator 26, and for supplying the sum digital output signal to the signal output terminal 12.

In the embodiment shown in FIG. 2, the differentiator 31, the quantizer 32, the delay circuit 33, the D/A converter 34 and the adder 30 constitute a third loop, and the output supplied from the quantizer 32 is the 3rd loop output. Thus, the third loop, the differentiator 37, and the adder 38 are added to the embodiment of FIG. 1.

The operation of this embodiment will now be described.

A third-loop input $V_{IN13}$ has a waveform of a phase opposite to that of the quantization error voltage generated by the quantizer 23. The connection between the second and third loops are the same as those between the first and second loops in FIG. 1.

An output $V_{\bar{O}12}$ from the adder 38 is derived from equation (7) and equation (11) below:

$$V_{\bar{O}12} = -V_{qN11} \cdot H_{11}/(1+Z^{-1} \cdot H_{12}) + V_{qN13}/(1+Z^{-1} \cdot H_{14})H_{15} \quad (11)$$

A digital output signal $V_{D\bar{O}}$ appearing at the signal output terminal 12 is a sum of $V_{\bar{O}11}$ of equation (3) and $V_{\bar{O}12}$ of equation (11) multiplied with $1/H_{13}$ through the differentiator 26. The transfer functions satisfy the following condition: $H_{11} = H_{12} = H_{13} = H_{14} = H_{15}$, and the digital output signal $V_{D\bar{O}}$ is calculated by equation (12) below:

$$V_{D\bar{O}} = -V_{IN} \cdot H_{11}/(1+Z^{-1} \cdot H_{11}) + V_{qN13}/\{(1+Z^{-1} \cdot H_{14}) \cdot H_{15} \cdot H_{13}\} \quad (12)$$

When the transfer functions $H_{11}$ to $H_{15}$ are defined as $1/(1-Z^{-1})$, the noise component $V_{TN}$ in equation (12) is given by equation (13) below:

$$V_{TN} = V_{qN13} \cdot (1-Z^{-1})^3 \quad (13)$$

When the number of loops is increased from two to three, the noise component $V_{TN}$ is changed from the 2nd order noise shaping in equation (8) to the 3rd order noise shaping in equation (13). The number of loops can be increased from (N−1) to N in the same manner as in the case wherein the number of loops is increased from two to three, since equations (11) and (12) have identical forms.

The oversampling converter of the present invention will now be compared with the conventional converters in FIGS. 20A and 20B and FIGS. 21A and 21B, so as to explain an increase in S/N ratio.

In order to do so, the S/N ratio of the circuit in FIG. 1 is calculated in the same manner as in those of the conventional circuits.

When the transfer function $H_{11}$ of the integrator 13, the transfer function $H_{12}$ of the integrator 22, and the transfer function $1/H_{13}$ of the differentiator 26 are the same as that of a single integrator (i.e., $H_{11}$ to $H_{13} = 1/(1-Z^{-1})$, the operation speed of the loop is mostly determined by the integrator. Respective loops in FIG. 1 are simultaneously operated at the same sampling frequency ($f_S$) as that of the conventional single integration type circuit. But, the sampling frequency ($f_S$) of the conventional circuit arrangement using the two cascade-connected integrators is decreased to ½ the sampling frequency ($f_S$) of the single integration type circuit.

If $f_{BW} = 16$ kHz, $f_S = 2048$ kHz, and the quantizer has a 2-bit resolution, an increase in S/N ratio by dispersion of the quantization noise over a wide range is 18 dB, an increase in S/N ratio by noise shaping is 59 dB, given by equation (8), and an increase in S/N ratio by $V_{qN12}$ being reduced to ½, given by equation (9) and (10), is 6 dB. Therefore, a total increase in S/N ratio is 83 dB, and the S/N ratio is 90.8 dB = 6 dB × (2 bits − 1) + 1.8 dB + 83 dB In the embodiment shown in FIG. 2, the sampling frequency ($f_S$) is not decreased even if the number of loops is increased to three.

Figure 21A:
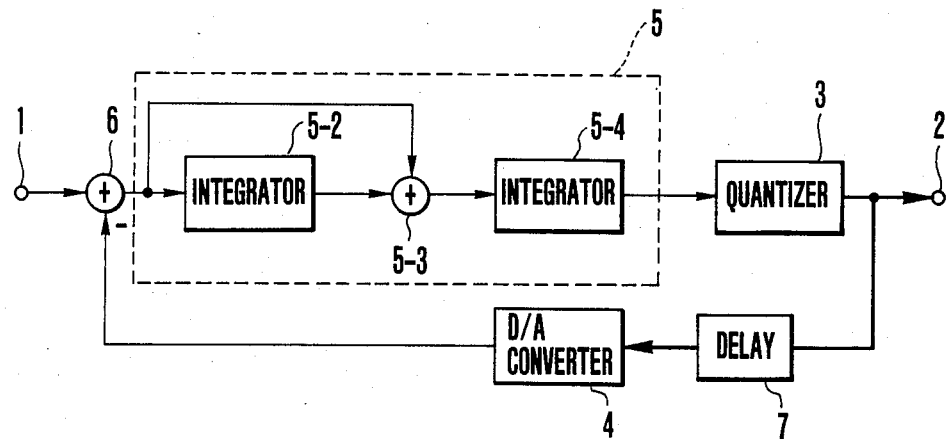
FIGS 21A and 21B are block diagrams of conventional double integral type A/D and D/A converters, respectively.
Figure 21B:
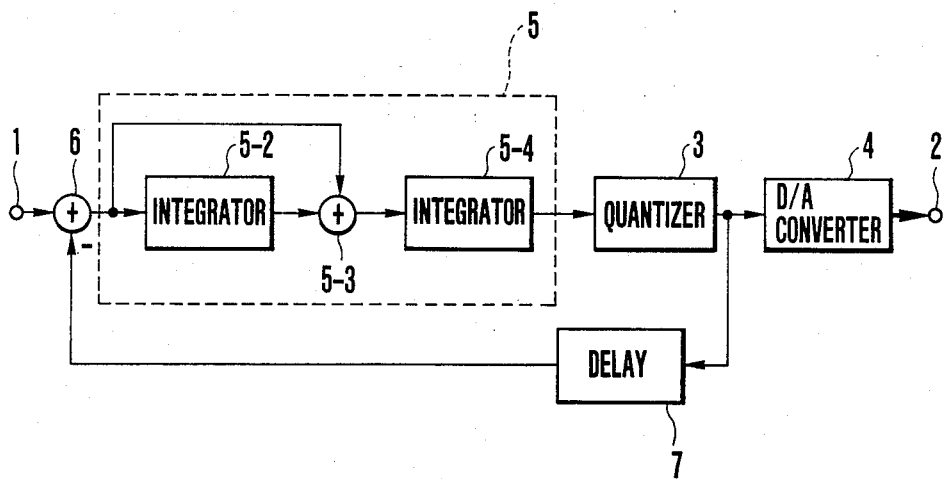

The embodiment of FIG. 2 is different from that of FIG. 1 in such a manner that the increase by noise shaping is 86 dB, that $V_{qN13}$ is decreased to ½ $V_{qN12}$, that is ¼ $V_{qN11}$ and thus increasing the S/N ratio by 12 dB. The S/N ratio of the embodiment of FIG. 2 is therefore increased by 33 dB over that of FIG. 1, and is as high as 123.8 dB = 6 dB × (2 bits − 1) + 1.8 dB + 116 dB Since the S/N ratio of the conventional circuit in FIG. 21A or 21B is 69.8 dB, the S/N ratio of the circuit of these embodiments are increased by 21 dB and 54 dB.

The above S/N ratio calculations are performed with equations (8) and (13). Equations (8) and (13) are given under the condition where the transfer functions $H_{11}$ to $H_{15}$ of the integrators and differentiators are identical. However, since the integrators 13 and 22 in the circuit of the embodiment in FIG. 1 are analog circuits, their transfer functions $H_{11}$ and $H_{12}$ may vary due to fabrication variations.

Figures 3A, 3B:
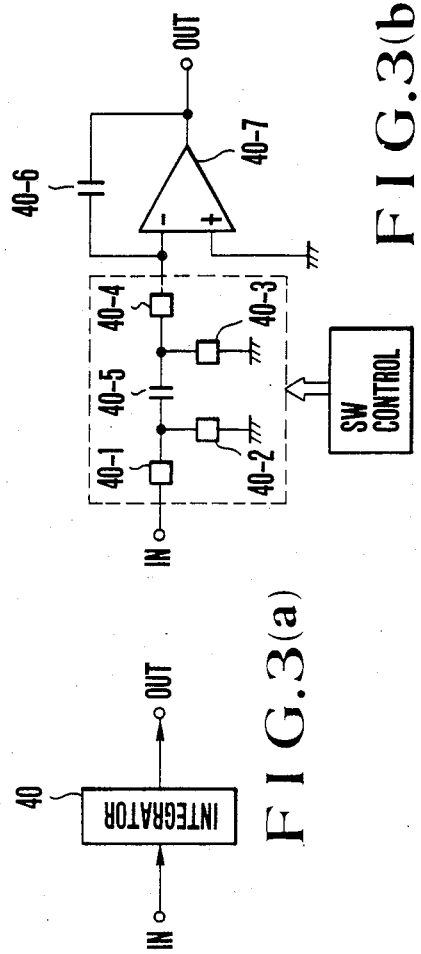
FIGS. 3(a) and 3(b) are circuit diagrams showing detailed arrangements of integrators used in the present invention.

FIGS. 3(a) and 3(b) are detailed arrangements of integrators constituted by switched capacitor circuits.

Referring to FIG. 3(a), reference numeral 40 denotes an integrator. In FIG. 3(b), showing the detailed arrangement of the integrator 40, reference numerals 40-1 to 40-4 denote switch circuits (analog switches); 40-5 and 40-6, capacitor elements; and 40-7, an operational amplifier. In these circuits, the ON/OFF operations of the switch circuits are controlled by signals from a switch control circuit, as in a known switched capacitor circuit. A converter using such a switched capacitor circuit is exemplified in U.S. Pat. No. 4,439,756.

In the integrator constituted by the above switched capacitor circuit, the transfer function varies due to precision of the capacitor elements 40-5, and 40-6. In the circuit shown in FIGS. 3(a) and 3(b), if capacitances of the capacitor elements 40-5 and 40-6 are given as $C_S$ and $C_I$, respectively, a transfer function $H_0$ is given by equation (14) below:

$$H_0 = (C_S/C_I)/(1 = Z^{-1}) \quad (14)$$

The gain of the transfer function $H_0$ varies due to specific precision of the capacitances $C_S$ and $C_I$ in equation (14).

In the circuit in FIG. 1, if $H_{11} = H_{12} = H_{13}$ in equation (6), $V_{qN11}$ is eliminated, yielding equation (8). The term $V_{qN11}$ remains under the following conditions:

$$H_{11} = \alpha_1/(1-Z^{-1})$$

$$H_{12} = \alpha_2/(1-Z^{-1})$$

$$H_{13} = 1/(1-Z^{-1})$$

(since the transfer function $H_{13}$ is one of a digital circuit, no variations in characteristics occur) and is derived as equation (15), wherein $\alpha_1$ and $\alpha_2$ are approximated as constants of substantially 1.0:

$$\text{Term } V_{qN11} \simeq V_{qN11} \cdot Z^{-1}(1-Z^{-1})(1-\alpha_1) \tag{15}$$

In equation (15), the value of $(1-\alpha_1)$ is determined by the capacitance ratio precision (0.5 to 0.05%). If $f_S = 2048$ kHz, $f_{BW} = 16$ kHz, and $\alpha_1 = 0.995$, comparison between the noise levels in equations (15) and (8) reveals the fact that the $V_{qN11}$ level in equation (15) is lower than the $V_{qN12}$ level in equation (8) by 20 dB. As a result, a decrease in S/N ratio in equation (8) is as small as 0.05 dB or less.

The A/D converter according to the present invention can obtain a high S/N ratio without using high-precision elements.

The detailed circuits of the integrators used in the embodiments of FIGS. 1 and 2 are exemplified by the circuits in FIGS. 3(a) and 3(b). The design conditions met by these integrators are:

(1) The integrator has a frequency transfer function such that the gain in a low frequency range, i.e. in the signal frequency range, is larger than that in the high frequency range;

(2) The loop including a quantizer and an integrator does not oscillate and is stably operated in response to an input signal; and (3) A digital differentiator having inverted transfer characteristics can be implemented.

The integrators in FIGS. 3(a) and 3(b) satisfy the above conditions.

The transfer functions ($H_{11}$, $H_{12}$, etc.) of the integrators of the respective loops must be identical, as described above. Even if the noise level is increased in a frequency range higher than the signal frequency range, the S/N ratio within the signal frequency range is not degraded. Therefore, the transfer functions need only be identical within the signal frequency range. In order to decrease high-frequency noise levels outside the signal bandwidth, the transfer functions are preferably identical throughout the bandwidth.

Figure 4:
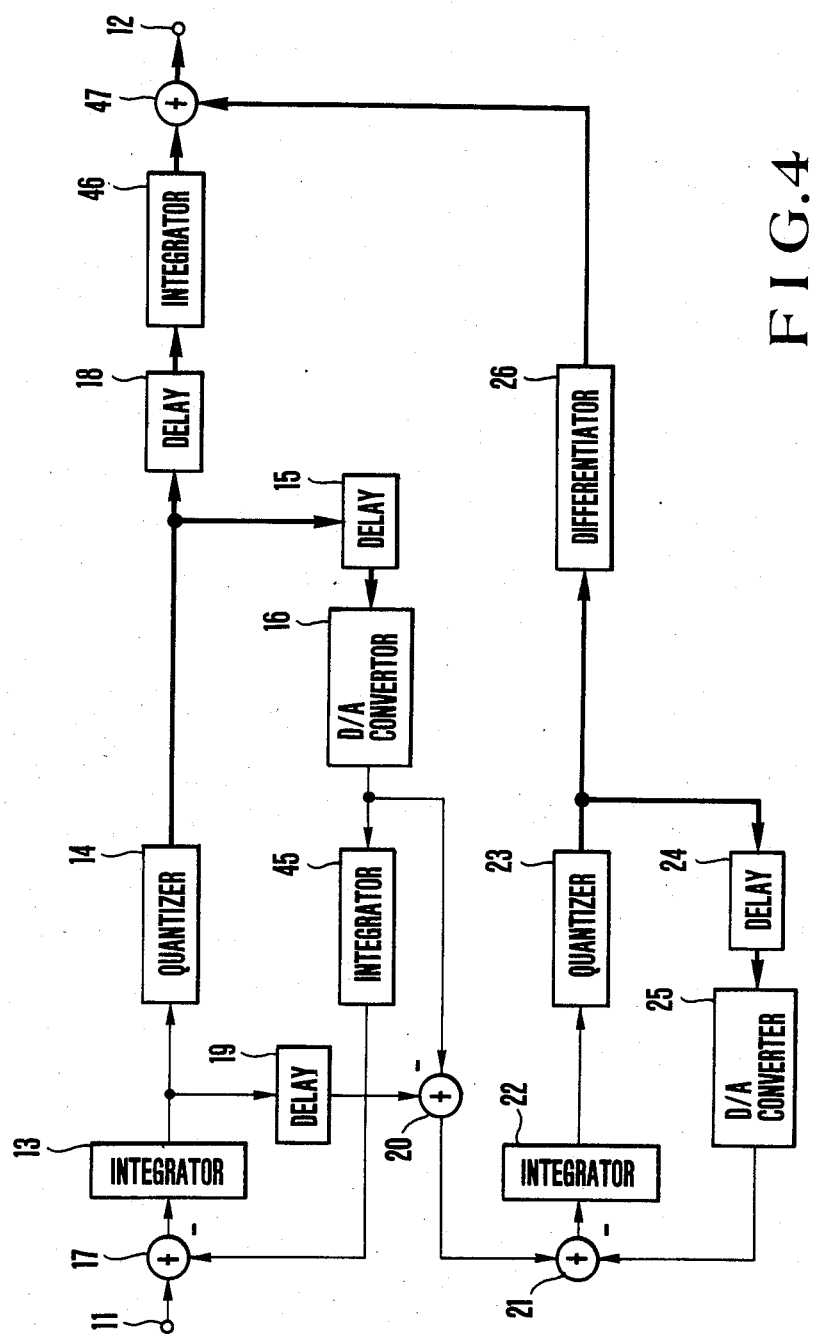
FIG. 4 is a block diagram of an oversampling A/D converter according to still another embodiment of the present invention.

FIG. 4 shows still another embodiment of the present invention. The converter in FIG. 4 is substantially the same as that in FIG. 1, except that integrators 45 and 46 are added. Reference numeral 47 denotes an adder for adding first-loop output through the integrator 46 and second-loop output through the differentiator 26 and supplying the sum digital signal to a signal output terminal 12.

With the above arrangement, the output from the integrator 45 is compared with the input signal voltage. Even if an output voltage from a D/A converter 16 is small, the circuit can be stably operated at high speed in response to the input signal due to a low-frequency gain of the integrator 45, under the condition that a level of a high-frequency component included in the input signal is low. A quantization error voltage generated by a quantizer 14 can be decreased to obtain a high S/N ratio. A digital output signal $V_{D\bar{O}}$ appearing at the signal output terminal 12 is given by equation (16) below. In this case, the transfer functions of the integrators 45 and 46 are given as $H_{16}$ and $H_{17}$, and other conditions are the same as for the converter in FIG. 1:

$$V_{D\bar{O}} = V_{IN} \cdot H_{11} \cdot H_{17}/(1 + Z^{-1} \cdot H_{11} \cdot H_{16}) + \tag{16}$$

$$V_{qN11} \cdot \{H_{17}/(1 + Z^{-1} \cdot H_{11} \cdot H_{16}) - H_{12}/(1 + Z^{-1} H_{12})H_{13}\} +$$

$$V_{qN12}/(1 + Z^{-1} \cdot H_{12})H_{13}$$

Since the term $V_{qN11}$ in equation (16) is eliminated in the same manner as in equation (7) for the converter of FIG. 1, the noise component is only the term $V_{qN12}$, and the frequency distribution characteristics can be obtained in the same manner thereas. In order to eliminate the term $V_{qN11}$ in the low frequency range, conditions $H_{11} = H_{12} = H_{13}$ and $H_{16} = H_{17}$ are satisfied in the low frequency range. In order to completely eliminate the term $V_{qN11}$, the transfer functions $H_{11}$ to $H_{17}$ are given in equations (17) below:

$$\left. \begin{array}{l} H_{11} = H_{12} = H_{13} = 1/(1 - Z^{-1}) \\ H_{16} = (2 - Z^{-1})/(1 - Z^{-1}) \\ H_{17} = 1/(1 - Z^{-1}) \end{array} \right\} \tag{17}$$

Substitution of equations (17) into equation (16) yields equation (18) below:

$$V_{D\bar{O}} = V_{IN} + V_{qN12} \cdot (1 - Z^{-1})^2 \tag{18}$$

As is apparent from equation (18), the noise component is the same as that in equation (8).

As described above, however, $V_{qN12}$ in the embodiment of FIG. 4 is smaller than that of FIG. 1. For example, if $f_{BW} = 16$ kHz and $f_S = 2048$ kHz, $H_{16}$, $H_{17}$ (the transfer function of the integrator 45, 46) at 16 kHz is about 26 dB. Thus, $V_{qN12}$ in the embodiment of FIG. 4 can be set to be lower than that in the embodiment of FIG. 1 by 26 dB.

If the integrator, as the analog circuit portion represented by thin lines in the drawing, is constituted by a switched capacitor circuit, the transfer characteristics with small variations can be obtained.

FIG. 5 is a circuit diagram showing a detailed arrangement of the embodiment of FIG. 1. The integrator in FIG. 1 comprises a single integrating element ($H_{11} = H_{12} = H_{13} = 1/(1-Z^{-1})$) constituted by a switched capacitor circuit. Thick lines in the drawing indicate digital signal lines, and thin lines indicate analog signal lines.

The same reference numerals in FIG. 5 denote the same parts in FIG. 1. Referring to FIG. 5, reference numerals 50-1 to 50-4, 50-8 to 50-11, 50-16 to 50-19, and 50-23 to 50-26 denote switch circuits (analog switches); 50-5, 50-7, 50-12, 50-20, 50-22 and 50-27, capacitor elements; 50-6 and 50-21, operational amplifiers; 51, an adder; and 52 and 53, switch control circuits. The quantizer 14 is constituted by voltage comparators 50-13 and 50-14. A quantizer 23 is constituted by voltage comparators 50-28 and 50-29.

The integrator in FIG. 5 is the same switching capacitor circuit type shown in FIGS. 3(a) and 3(b).

The operation of the embodiment in FIG. 5 will be described hereinafter.

The capacitor element 50-5 (capacitance $C_{S1}$) is charged with an input terminal voltage from a signal input terminal 11. The charge for the capacitance $C_{S1}$ is integrated to the capacitor element 50-7 (capacitance $C_{I1}$) by the operational amplifier 50-6, so that an integral of the input terminal voltage appears at the output of the operational amplifier 50-6. Similarly, an integral of the output voltage from the operational amplifier 50-6 appears at the output of the operational amplifier 50-21. The quantizers 14 and 23 have a two-bit resolution each. A quantized voltage from the quantizer 14 represents three values, i.e., 0 and $\pm V_{REF}$. An input voltage of the quantizer 14 is compared by the voltage comparators 50-13 and 50-14 with $\pm V_{REF}/2$. When the input voltage exceeds $\pm V_{REF}/2$, the quantizer 14 quantizes the input voltage at $\pm V_{REF}$. When the input voltage falls within the range between $V_{REF}/2$ and $-V_{REF}/2$, the quantizer 14 quantizes it at 0. When the input voltage is lower than $-V_{REF}/2$, the quantizer 14 quantizes it at $-V_{REF}$. The quantized voltage from the quantizer 23 has only a ½ amplitude of that of the quantizer 14 and represents three values, i.e., 0 and $\pm V_{REF}/2$. For this reason, the voltage comparators 50-28 and 50-29 compare the input voltage with a voltage of $\pm V_{REF}/4$ to perform quantization. A D/A conversion function can be achieved such that the switches 50-8, 50-9, 50-10, and 50-11 are controlled by the switch control circuit 52 to charge the capacitor element 50-12 (capacitance $C_{D1}$) with the voltage $V_{REF}$, and to integrate the capacitance $C_{I1}$ to the charge given by the capacitance $C_{D1}$.

When the capacitor element 50-12 with the capacitance $C_{D1}$ is charged with the voltage $V_{REF}$, one of the charging modes (i.e., negative charging, positive charging, or no charging) is selected, and the analog voltage corresponding to the selected one (i.e., $\pm V_{REF}$ or 0) is added to the integral. The switch control circuits 53, the switches 50-23 to 50-26, and the capacitor element 50-27 (capacitance $C_{D2}$) are operated in the same manner as described above. The charge of the capacitor element 50-5 ($C_{S1}$) is integrated in the first half cycle ($\phi A$ on) of the sampling period. The charge of the capacitor element 50-12 ($C_{D1}$) is integrated in the second half cycle ($\phi B$ on) of the sampling period. The input voltage to the quantizer 14 appears at the output of the operational amplifier 50-6 in the first half cycle (next $\phi A$ on) of the sampling period. The voltage corresponding to the output from the adder 20 in FIG. 1 appears at the output of the operational amplifier 50-6 in the second half cycle (next $\phi B$ on) of the sampling period. In the first half cycle ($\phi A$) of the sampling period the quantizer 14 is operated and in the second half cycle charges the capacitor element 50-20 ($C_{S2}$) with the output voltage from the operational amplifier 50-6. The same function as described with reference to FIG. 1 can be achieved with the converter in FIG. 5. The digital signal delay circuits 50-15 and 50-30 can easily be constituted by D flip-flops. A differentiator 26 has a transfer function $1/H_3 = (1 = Z^{-1})$ provided by the delay circuit 50-30 and the adder 50-31.

Figure 6:
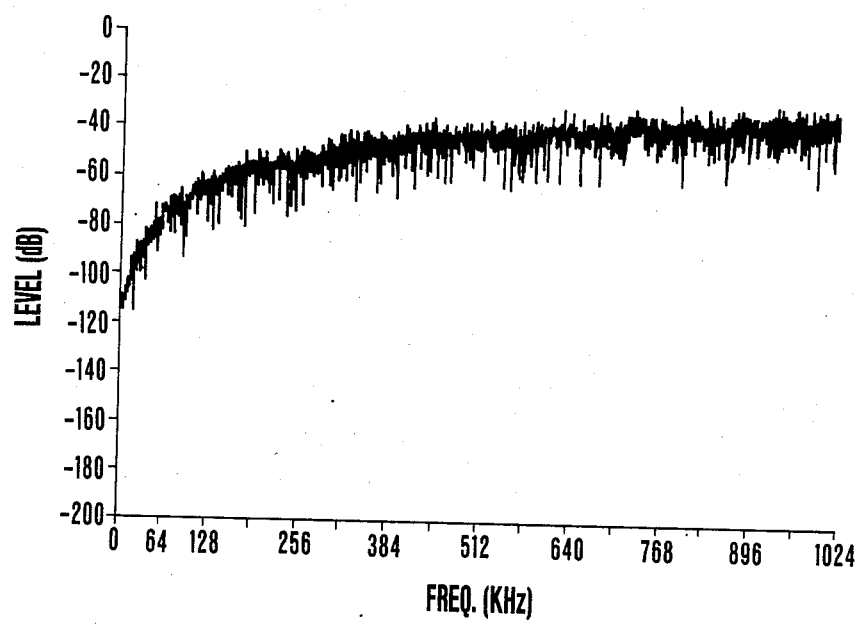
FIGS. 6 and 7 are respectively graphs showing output noise frequency spectral distribution characteristics and S/N ratio characteristics of the A/D converter.

FIG. 6 is a graph showing the frequency spectrum distribution characteristics of the digital signal output in FIG. 5, that is, the output noise frequency spectrum distribution characteristics of the A/D converter of this embodiment. In the graph, $f_S = 2048$ kHz, 0 dB = 1 Vop, and a spectrum analizer bandwidth = 500 Hz.

It is readily understood from the graph that the noise level in the low frequency range is greatly decreased.

Figure 7:
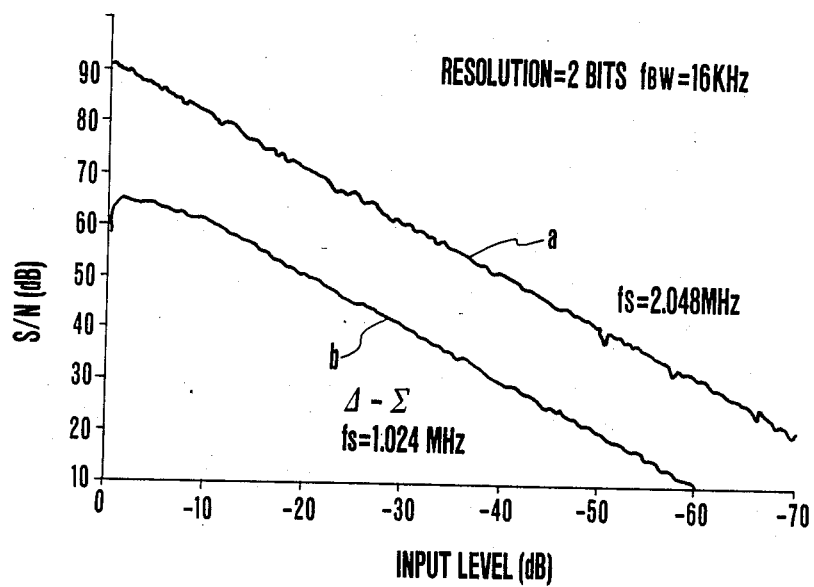

FIG. 7 shows as graph of the S/N ratio characteristics (a curve a) of the A/D converter in FIG. 5. Curve b represents the S/N ratio characteristics of the conventional A/D converter with cascade-connected integrators. In the conventional converter, two integrators are cascade-connected and the sampling frequency is determined by the processing speed of the integrator, so that the sampling frequency is ½ that of this embodiment.

The S/N ratio characteristics in FIG. 7 are obtained when $f_S = 2048$ kHz and $f_{BW} = 16$ kHz. As is apparent from the graph, the S/N ratio linearly changes as a function of the input signal amplitude level. The resultant characteristics are substantially the same as those of a conventional linear 15-bit A/D converter. The S/N ratio calculated, as previously described, is 90.8 dB, which substantially coincides with the S/N ratio at the 0-dB input level in FIG. 7.

Figure 8:
FIGS. 8(a) to 8(i) are respectively timing charts for explaining the operation of the circuit shown in FIG. 5.

A detailed operation of the switch control circuits 52, 53 will be described hereinafter. The control circuit processes clock pulses CLK supplied from a clock generator (not shown) and generates two phase clocks $\phi A$ and B whose ON times do not overlap, as shown in FIGS. 8(b) and 8(c), by a delay circuit DL, a NOR gate NR and an AND gate AD. The clocks $\phi A$ and $\phi B$ are supplied to the analog switches 50-1 to 50-4, 50-8 and 50-9 which are turned on/off. The control circuit also has two switches $S_1$ and $S_2$ which are switched in response to an output from the quantizer 14, thereby generating and supplying clocks $\phi C$ and $\phi D$ respectively to the analog switches 50-10 and 50-11 which are turned on/off, as shown in FIGS. 8(d) to 8(i).

When an input to the quantizer 14 is less than $-V_{REF}/2$, contacts (2) of the switches $S_1$ and $S_2$ are turned on, and the clocks $\phi A$ and $\phi B$ are supplied to the $\phi D$ and $\phi C$ clock terminals respectively as shown in FIGS. 8(f) and 8(g). When the clocks $\phi A$ and $\phi D$ are kept high (a high potential state), the capacitor element 50-12 is charged with the voltage of $V_{REF}$. However, when the clocks $\phi B$ and $\phi C$ are kept high, the charge is integrated in the capacitor element 50-7, so that an integrator output is increased. When the input to the quantizer 14 is $V_{REF}/2$ or more, contacts (1) of the switches $S_1$ and $S_2$ are turned on, the clocks $\phi A$ and $\phi B$ are respectively supplied to the $\phi C$ and $\phi D$ clock terminals as shown in FIGS. 8(d) and 8(e). When the clocks $\phi B$ and $\phi C$ are kept high (a high potential state), the capacitor element 50-12 is discharged. However, when the clocks $\phi B$ and $\phi D$ are kept high, the capacitor element 50-12 is charged with the voltage of $V_{REF}$. At the same time, the same charge (opposite polarity), as contacts (1) are turned on, is integrated in the capacitor element 50-7, thereby decreasing the integrator output. When the input to the quantizer 14 falls within $-V_{REF}/2$ and $V_{REF}/2$, contacts (3) of the switches $S_1$ and $S_2$ are turned on. A high potential (high) and a low potential (low) are supplied to the $\phi C$ and $\phi D$ clock terminals, respectively as shown in FIGS. 8(h) and 8(i). The switch 50-10 is turned on, and the switch 50-11 is turned off. In this case, the capacitor element 50-12 is not charged and is not subjected to integration.

According to the present invention as described above, a multiple quantization operation is performed by a plurality of quantization loops to greatly decrease the noise level in the low frequency range, so that a high S/N ratio can be obtained in a signal frequency range sufficiently lower than the sampling frequency $f_S$. In addition, since the plural quantization loops are simultaneoulsy operated, high-speed processing can be performed at a high sampling frequency $f_S$. This high sampling frequency $f_S$ further increases the S/N ratio. At the same time, a cut-off frequency $f_C$ of a folding prevention filter arranged in front of the A/D converter can be set high. Furthermore, the filter with a high cut-off frequency $f_C$ decreases the sizes of the resistor and capacitor elements. Thus, the elements can be economically formed on an integrated circuit. Even if the quantizer has a 1- or 2-bit resolution which provides good linearity independently of element precision, a high S/N ratio can be obtained. The specific precision of the plurality of quantization loops is easily obtained on the current integrated circuit fabrication technique, so that high-precision elements can be eliminated and fine adjustment after fabrication need not be performed, thus providing economical and other practical advantages.

As is apparent from the embodiment shown in FIG. 5, the analog circuit scale is very small, and a digital filter can be used in place of the conventional analog filter to eliminate outband noise components falling outside the signal bandwidth. However, along with advances of IC micropatterning, the integration density of digital circuits is larger than that of analog circuits. Because of this, a digital circuit arrangement decreases the chip size and the present invention is thus suitable for integration circuits. Therefore, the chip size of the digital filter can be decreased as compared with that of the precise analog circuit. For example, when the A/D converter is formed together with a filter on a single chip, the conventional circuit requires an analog filter in front of the A/D converter and is mainly constituted by analog components. However, according to the present invention, since the filter is constituted by a digital circuit, the number of analog circuits is very small. Therefore, the present invention can provide a compact A/D converter of high precision at low cost.

The oversampling A/D converter of the present invention provides unique effects as compared with the conventional A/D converter and performs conversion at a frequency higher than the signal frequency with high conversion precision.

Figure 9:
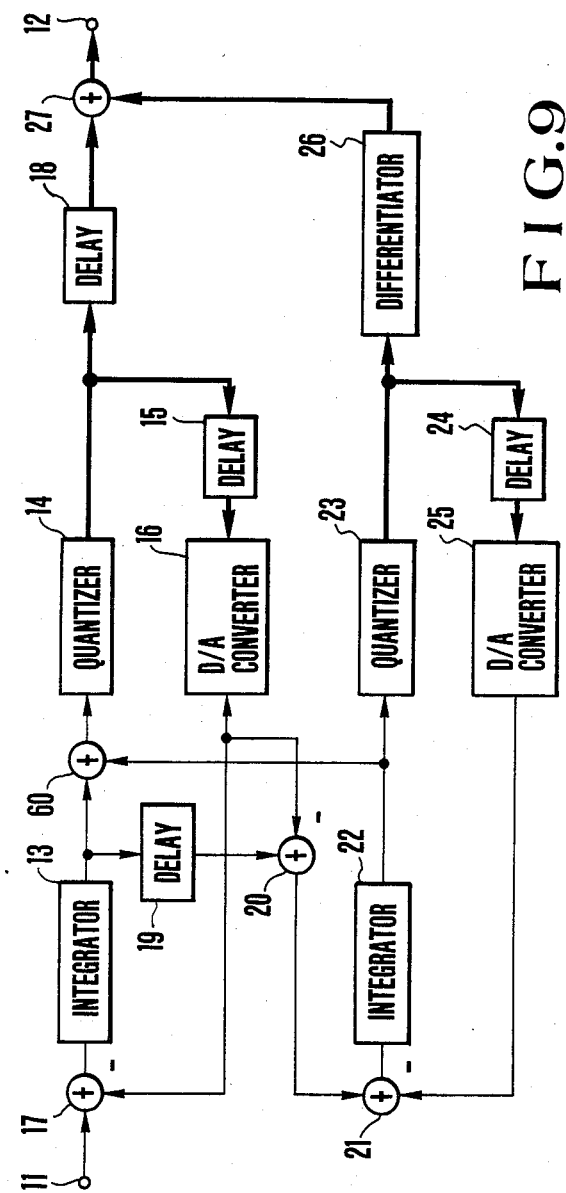
FIG. 9 is a block diagram showing a modification of the embodiment shown in FIG. 1.

FIG. 9 shows still another embodiment of the present invention. The same reference numerals in FIG. 9 denote the same parts in FIG. 1. The embodiment in FIG. 9 is substantially the same as that in FIG. 1, except that an output from an integrator constituting a second loop, i.e., a subloop is fed back to the output side of an integrator of a first loop, i.e., a main loop. The output from an integrator 13 is added by an adder 60 to an output from an integrator 22, and the sum signal is supplied to a quantizer 14. With this arrangement, the quantization error of the main loop can be suppressed even if a gain of an operational amplifier constituting the integrator is low.

More specifically, the adder 60 adds the output from the integrator 13 of the main loop and the output from the integrator 22 of the subloop, and supplies the sum signal to the quantizer 14, so that a voltage $V_{D\bar{O}}$ appearing at an output terminal 12 is given as follows:

$$V_{D\bar{O}} = V_{IN} \cdot Z^{-1} \cdot H_{11}/(1 + Z^{-1} \cdot H_{11}) + \quad (19)$$

$$\{(H_{13} - H_{11})Z^{-1}/(1 + 2Z^{-1} \cdot H_{11})H_{13}\} \times$$

$$\{V_{qN11} - V_{qN12} \cdot Z^{-1} \cdot H_{11}/(1 + Z^{-1} \cdot H_{11})\} +$$

$$V_{qN12}/(1 + Z^{-1} \cdot H_{11})H_{13}$$

wherein $H_{11}=H_{12}$ is assumed for the sake of simplicity. When the output from the integrator 13 is as high as the ideal state and $H_{13}=H_{11}$, the same S/N ratio as in the embodiment of FIG. 1 can be obtained.

However, when the gain of the operational amplifier constituting the integrator 13 is not sufficiently high and so $H_{13} \neq H_{11}$, a high gain in the second term including $V_{qN11}$ in equation (19) is not eliminated. Since $H_{11}$ is the transfer function of the integrator 13, so that $1 << H_{11}$ at low frequency range is established.

The second term of equation (19) is given as follows:

$$(V_{qN11} - V_{qN12})(H_{13} - H_{11})/2H_{11} \cdot H_{13} \quad (20)$$

$V_{qN11}$ is the quantization error generated upon quantization of a sum of output from the integrators of the first loop (main loop) and the second loop (subloop), and $V_{qN12}$ is the quantization error when only the output from the second-loop integrator is quantized. It is difficult to analytically evaluate $V_{qN11}$ and $V_{qN12}$. However, $V_{qN12}$ is subtracted from $V_{qN11}$ to decrease a value given by equation (20). Therefore, a decrease in S/N ratio is small even if a gain of the operational amplifier is not sufficiently high.

Figure 11A:
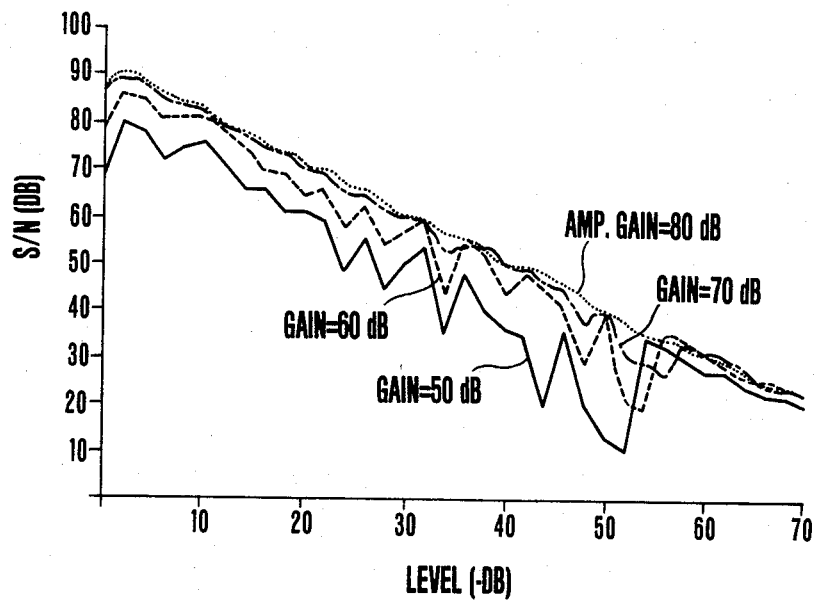
FIGS. 11(a) and 11(b) are respectively graphs showing the S/N ratio-amplifier gain characteristics.
Figure 11B:
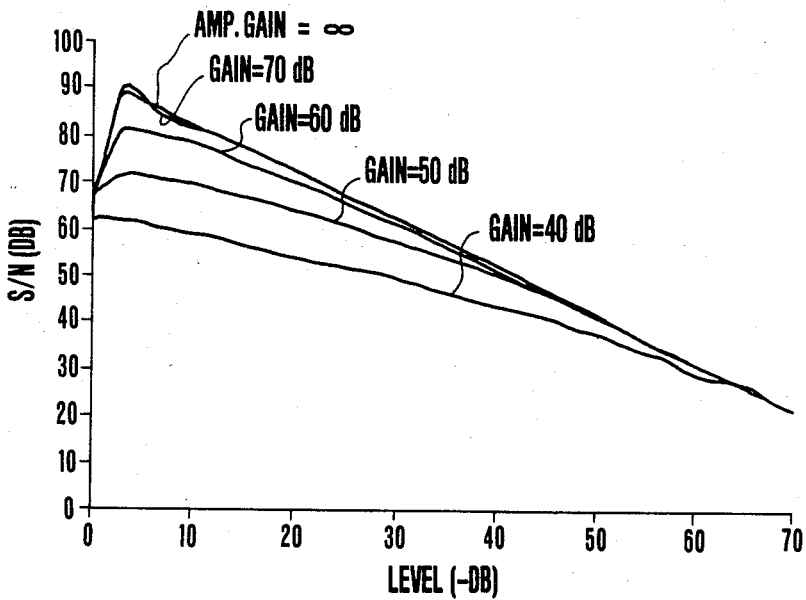

FIG. 11(a) shows the S/N ratio of teh A/D converter of FIG. 1 and FIG. 11(b) shows that of the FIG. 9 when the sampling frequency $f_S=2.048$ MHz, the signal bandwidth $f_{BW}=4$ kHz, and the quantizer has a one-bit resolution.

Figure 10:
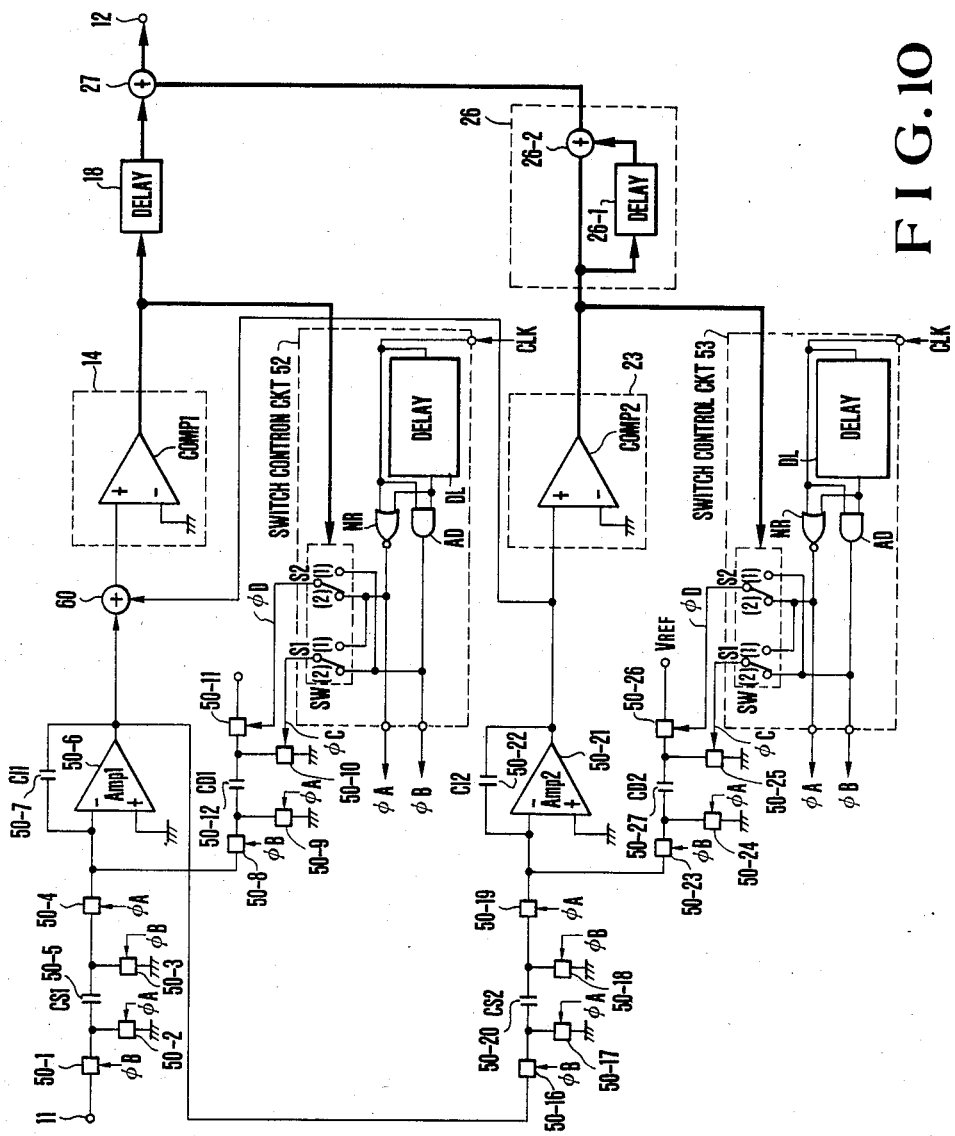
FIG. 10 is a block diagram showing the detailed arrangement of the converter in FIG. 9.

FIG. 10 shows a detailed arrangement of the converter in FIG. 9. In this case, the integrator and the D/A converter are constituted by switched capacitor circuits in the same as the detailed arrangement described in FIG. 5. The same reference numerals in FIG. 10 denote the same parts as in FIG. 5. However, quantizers 14 and 23 are constituted by single comparators COMP1 and COMP2, respectively, unlike in the embodiment of FIG. 5. Each comparator receives the output from the corresponding operational amplifier 50-6, 50-21 constituting the integrator at the noninverting input terminal, and the inverting input terminal of the comparator is grounded.

The operation of the converter with the arrangement in FIG. 10 will be described hereinafter.

An input terminal voltage from a signal input terminal 11 is charged by a capacitor element 50-5 (capacitance $C_{S1}$), and the charge by the capacitance $C_{S1}$ is integrated by an operational amplifier 50-6 to charge a capacitor element 50-7 ($C_{I1}$), so that an integral of the input terminal voltage appears at the output of the operational amplifier 50-6. The capacitor element 50-5 ($C_{I1}$) is charged, when analog switches 50-1 and 50-3 turn on and analog switches 50-2 and 50-4 are kept off by clocks $\phi A$ and $\phi B$ supplied from a switch control circuit 52. Then, the clock $\phi B$ turns off the analog switches 50-1 and 50-3 and the clock $\phi A$ turns on the analog switches 50-2 and 50-4, thereby integrating the charge by the capacitance $C_{S1}$ on the element 50-7 ($C_{I1}$). The relation of the switch control circuit 52 and analog switches 50-1 to 50-4, and 50-8 to 50-11 in FIG. 10 is the same as in FIG. 5. Similarly, the output voltage from the operational amplifier 50-6 is charged by a capacitor element 50-20 (capacitance $C_{S2}$), and the charge by the capacitance $C_{S2}$ is integrated by an operational amplifier 50-21 to charge a capacitor element 50-22 ($C_{I2}$), so that an integral appears at the output of the operational amplifier 50-21. In this case, charging timings of the capacitor elements 50-20 ($C_{S2}$) and 50-22 ($C_{I2}$) are the same as those of the capacitor elements 50-5 ($C_{S1}$) and 50-7 ($C_{I1}$). When integration of the capacitor elements 50-5 ($C_{S1}$) and 50-20 ($C_{S2}$) is completed, the quantizers 14 and 23 perform quantization. THe quantizer 14 quantizes the sum of the integral values, and the quantizer 23 quantizes only the integral value of the capacitor element 50-20 ($C_{S2}$). The quantizers 14 and 23 each have a one-bit resolution. In response to the quantized voltage from the quantizer 14, the switch control circuit presets a capacitor element 50-12 ($C_{D1}$) controlled by the above-mentioned technique. The charge of the capacitor element 50-12 ($C_{D1}$) is integrated to charge the capacitor element 50-7 ($C_{I1}$) to obtain the function of a D/A converter 16 in FIG. 9.

Since the timing of the integral operation of the charge of the capacitor element 50-5 ($C_{S1}$) is offset by ½ period from that of the capacitor elements 50-12 ($C_{D1}$), the capacitor element 50-20 ($C_{S2}$) is charged at the same time of the $C_{D1}$ charge integration, and charging from the capacitor element 50-12 ($C_{D1}$) to the capacitor element 50-20 ($C_{S2}$) can be properly performed. In the embodiment shown in FIG. 10, since the output from operational amplifier 50-21 is not supplied to a third loop, a switch control circuit 53 can be operated to simultaneously perform and integral operation of the capacitor element 50-20 ($C_{S2}$) and 50-27 ($C_{D2}$). The relation of the switch control circuit 53 and analog switches 50-16 to 50-19 and 50-23 to 50-26 in FIG. 10 is the same as in FIG. 5.

The capacitor elements 50-12 ($C_{D1}$) and 50-27 ($C_{D2}$) are charged with the reference voltage $V_{REF}$, polarities of which are changed in response to outputs supplied from the voltage comparators COMP1 and COMP2 constituting the quantizers 14 and 23 to the switch control circuits 52 and 53. As a result, one of the voltage values $+V_{REF}$ or $-V_{REF}$ is fed back to each integrator. Since a differentiator 26 processes the digital signal, it can be constituted by a delay circuit such as a latch circuit and a one-bit digital adder.

In the embodiment shown in FIG. 9, almost no decrease in S/N ratio occurs at a low input signal level as compared with a case wherein the amplifier has a sufficiently high gain. A decrease in S/N ratio is detected at a large input level. However, such a decrease rarely presents any practical problems.

Figure 12:
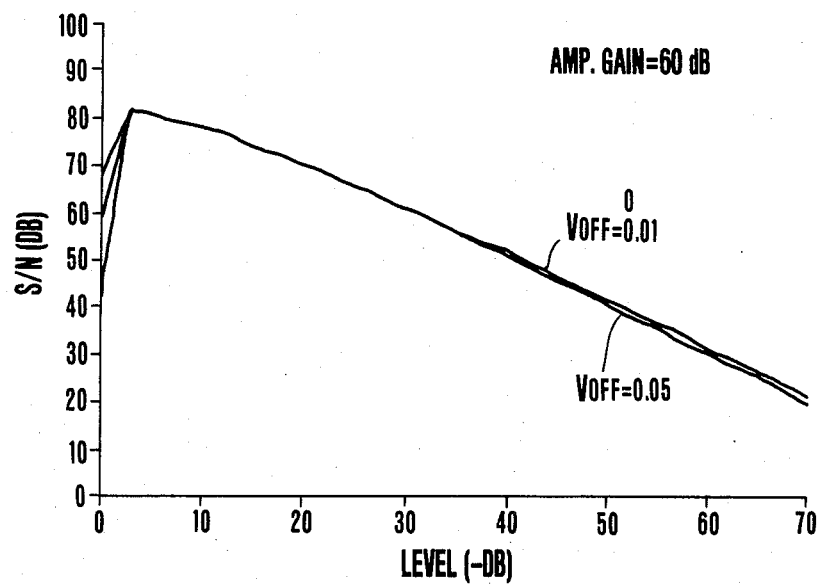
FIG. 12 is a graph showing the S/N ratio-offset voltage dependency characteristics.

FIG. 12 is a graph showing changes in S/N ratio when a DC offset voltage is superposed on an analog signal input in the embodiment of FIG. 10. Even if an offset voltage of 0.01 to 0.05 V is superposed on the input analog signal within the input signal range, the S/N ratio is found not to change substantially.

Figure 13:
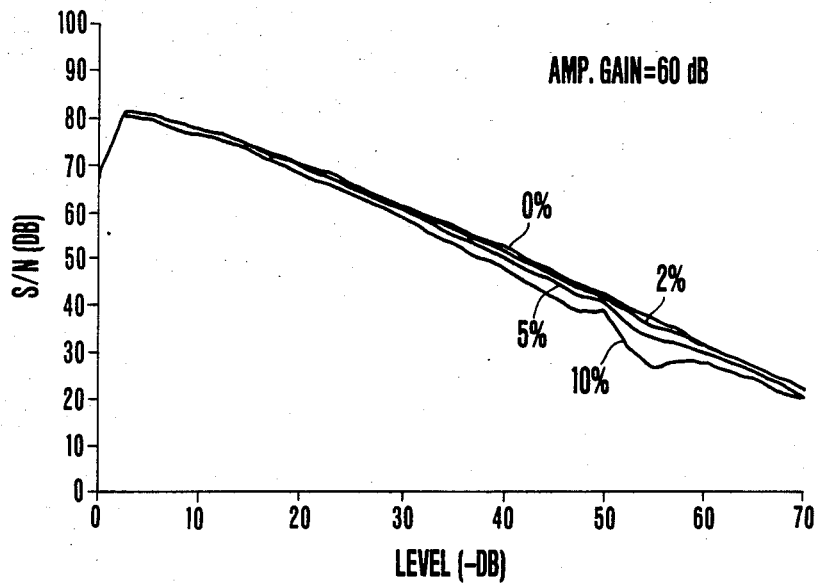
FIG. 13 is a graph showing the S/N-capacitance ratio precision dependency characteristics.

FIG. 13 is a graph showing the relationship between the S/N ratio and the specific precision of the capacitor elements in the switched capacitor circuit used in the embodiment of FIG. 10. FIG. 13 exemplifies the capacitor element 50-27 ($C_{D2}$). The same influences as in the capacitor element 50-27 ($C_{D2}$) are experimentally confirmed for the capacitors 50-5 ($C_{S1}$), 50-20 ($C_{S2}$), and 50-12 ($C_{D1}$). When the capacitor elements are formed on an integrated circuit, their specific precision is 0.1% to 1.0% with no trimming. Therefore, the S/N ratio is found not to be degraded by the specific precision of the capacitor elements.

FIG. 14 shows a modification of the embodiment shown in FIG. 10. The adder 60 in FIG. 10 is eliminated, and the output from the operational amplifier 50-21 constituting the integrator of the second loop is connected to the inverting input terminal of the comparator COMP1 constituting the quantizer 14. When switching orders of the analog switches 50-18 and 50-19 connected to the capacitor element 50-20 ($C_{S2}$) are reversed, the polarity of the signal is inverted. Therefore, when the operation timings of the above-mentioned switches connected to the capacitor element 50-20 ($C_{S2}$) are inverted, equivalent add operation corresponding to adder 61 in FIG. 10, can be performed. In this case, the adder 60 in FIG. 10 can be omitted. All other arrangements in FIG. 14 are the same as those in FIG. 10.

With the circuit arrangements in FIGS. 10 and 14, a high S/N ratio can be obtained by using an operational amplifier with a low gain without increasing the circuit size. In addition, the dependency of S/N ratio on the input offset voltage is small. High precision can be achieved even if elements with low precision are used. Therefore, an A/D converter with high precision can be formed on an integrated circuit at low cost without performing any adjustments after fabrication.

Figure 15:
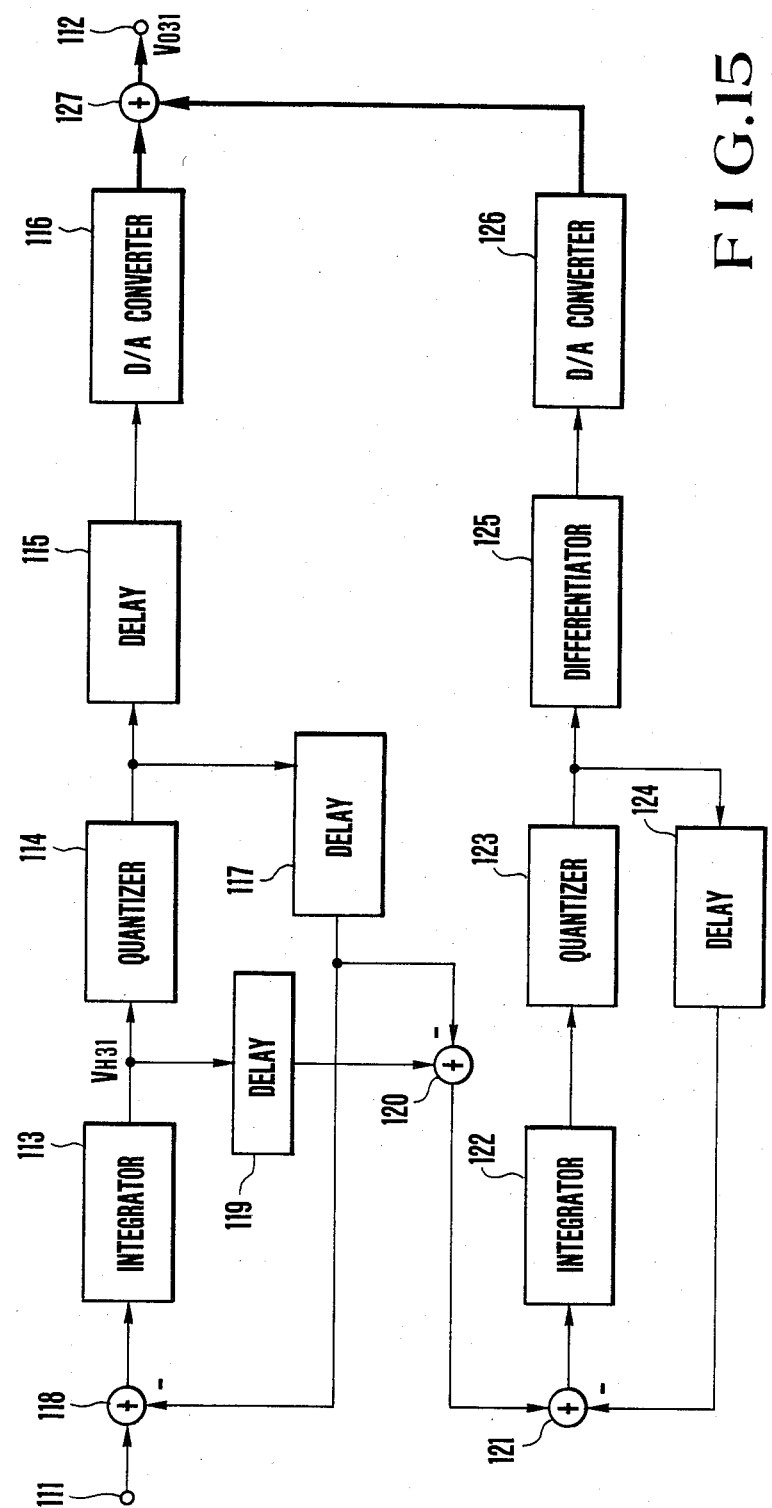
FIG. 15 is a block diagram of an oversampling D/A converter according to still another embodiment of the present invention.

FIG. 15 shows still another embodiment wherein an oversampling converter of the present invention is applied to a D/A converter. The D/A converter is constituted by two loops, each of which includes an integration and a quantizer.

Referring to FIG. 15, reference numeral 111 denotes a digital signal input terminal; 112, an analog signal output terminal; 113, an integrator for integrating a difference between the digital input signal and a feedback signal; 114, a quantizer for decreasing a resolution (the number of bits) of the digital output from the integrator 113; 115, a delay circuit for receiving an output from the quantizer 114; 116, a D/A converter for converting the digital signal as an output from the delay circuit 115 to an analog signal; 117, a delay circuit for receiving the output from the quantizer 114; 118, an adder for adding the digital input signal from the digital signal input terminal 111 and the feedback signal from the delay circuit 117 and for supplying a sum signal to the integrator 113; 119, a delay circuit for receiving the output from the integrator 113; 120, an adder for adding an output from the delay circuit 119 and an output from the delay circuit 117; 121, an adder for receiving an output from the adder 120 and an output from a delay circuit 124; 122, an integrator for integrating a difference between the feedback signal and the input digital signal as an output from the adder 121; 123, a quantizer for decreasing a resolution of a digital output from the integrator 122; 124, the delay circuit for receiving an output from the quantizer 123 and supplying the feedback signal to the adder 121; 125, a differentiator for differentiating an output from the quantizer 123; 126, a D/A converter for converting a digital signal as output from the differentiator 125 to an analog signal; and 127, an adder for adding an output from the D/A converter 126 and the output from the D/A converter 116. An output from the adder 127 appears at the analog signal output terminal 112. Thin lines indicate digital signal lines, and thick lines indicate analog signal lines.

The integrators 113 and 122 have higher gains when a frequency of the input signal is lower, and have transfer functions $H_{31}$ and $H_{32}$, respectively. The differentiator 125 has an inverted transfer function of that of the integrator 113, which is given as $1/H_{33}$.

In the embodiment shown in FIG. 15, the integrator 113, the quantizer 114, the delay circuit 117, and the adder 118 constitute a first loop, and the integrator 122, the quantizer 123, the delay circuit 124, and the adder 121 constitute a second loop and an output from the delay circuit 115 is the first loop output and an output from the quantizer 123 is the 2nd loop output.

The operation of the D/A converter in FIG. 15 will be described hereinafter.

A difference between outputs from the first-loop integrator 113 and the quantizer 114 is calculated by the adder 120 as a quantization error in the first loop. The output from the adder 120 serves as an input signal for the second loop. The output from the first-loop quantizer 114 and a signal obtained by processing the output from the second-loop quantizer 123 by the differentiator 125 are converted by the D/A converters 116 and 126 to analog signals, respectively. The converted analog signals are then added by the adder 127, thereby obtaining the analog output signal. Quantization errors of the quantizers 114 and 123 are given as $V_{qN31}$ and $V_{qN32}$, and error components included in the analog output signal are calculated.

The outputs from the first-loop quantizer 114 and the integrator 113 are given as $V_{\bar{O}31}$ and $V_{H31}$, and they are calculated by equations (21) and (22) as follows:

$$V_{\bar{O}31} = V_{IN} \cdot H_{31}/(1+Z^{-1} \cdot H_{31}) + V_{qN31}/(1+Z^{-1} \cdot H_{31}) \quad (21)$$

$$V_{H31} = V_{IN} \cdot H_{31}/(1+Z^{-1} \cdot H_{31}) - V_{qN31} \cdot Z^{-1} \cdot H_{31}/(1+Z^{-1} \cdot H_{31}) \quad (22)$$

The second-loop input signal is given as $V_{IN32}$, and equations (21) and (22) yield equation (22) below:

$$V_{IN32} = (V_{H31} - V_{\bar{O}31}) = -V_{qN31} \quad (23)$$

An error component of $V_{\bar{O}31}$ in equation (21) is equal to that of the conventional circuit which is given in equation (1). Equation (23) indicates that only the quantization error $V_{qN31}$ is detected by the calculation of a difference between $V_{\bar{O}31}$ and $V_{H31}$.

An analog output signal $V_{A\bar{O}}$ appearing at the analog signal output terminal 112 is calculated by equation (24) below:

$$V_{A\bar{O}} = V_{IN} \cdot H_{31}/(1+Z^{-1} \cdot H_{31}) + \quad (24)$$

$$V_{qN31} \cdot (H_{31} - H_{32} + Z^{-1} \cdot H_{32} \cdot H_{33} -$$

$$Z^{-1} \cdot H_{31} \cdot H_{32})/\{(1 + Z^{-1} \cdot H_{31})(1 +$$

$$Z^{-1} \cdot H_{32})H_{33}\} + V_{qN32}\{1/(1 + Z^{-1} \cdot H_{32})H_{33}\}$$

The term $V_{qN31}$ in equation (24) is completely eliminated if $H_{31} = H_{32} = H_{33}$, thereby deriving equation (25):

$$V_{A\bar{O}} = V_{IN} \cdot H_{31}/(1+Z^{-1} \cdot H_{31}) + V_{qN32}/(1+Z^{-1} \cdot H_{32}) \cdot H_{33} \quad (25)$$

If the noise component in equation (25) is $V_{TN}$ and the transfer functions $H_{31}$ to $H_{33}$ satisfy condition $H_{31} = H_{32} = H_{33} = 1/(1-Z^{-1})$ as the transfer function of the single integrator, equation (26) is derived from equation (25):

$$V_{TN} = V_{qN32} \cdot (1-Z^{-1})^2 \quad (26)$$

Equation (26) indicates that noise voltages are distributed at the same frequency characteristics as indicated by equation (2') for the conventional circuit. A magnitude of the quantization error $V_{qN32}$ is proportional to a maximum input amplitude of the second loop when the resolution of the quantizer 123 is predetermined. The second-loop input is the first-loop quantization error represented by equation (23), and the first-loop quantization error is determined by the resolution of the first-loop quantizer 114.

If a range of the digital signal applied to the digital signal input terminal 111 is normalized to be $\pm 1$, and the quantizers 114 and 123 have resolutions of $N_{qN31}$ and $N_{qN32}$ bits, amplitude ranges of the quantization errors $V_{qN31}$ and $V_{qN32}$ are given by equations (27) and (28) below:

$$-2^{-(Nq31-1)} \leq V_{qN31} \leq 2^{-(Nq31-1)} \quad (27)$$

$$\{2^{-(Nq31-1)} \cdot 2^{-(Nq32-1)}\} \leq V_{qN32}$$

$$\leq 2^{-(Nq31-1)} \cdot 2^{-(Nq32-1)} \quad (28)$$

As previously described, linearity of the D/A converter (116, 126) is guaranteed independently of element precision when the converter has a one- to two-bit resolution. Since the resolution of the D/A converter is the same as that of the quantizer, the quantizer normally has a one- to two-bit resolution. When the quantizer has a one-bit resolution, the amplitude ranges of $V_{qN31}$ and $V_{qN32}$ are $\pm 1$. When the quantizer has a two-bit resolution, the amplitude range of $V_{qN31}$ is $\pm 0.5$, and the amplitude range of $V_{qN32}$ is $\pm 0.25$. The relationship between $V_{qN}$ in equation (2') and the quantizer resolution is the same as equation (27) for $V_{qN31}$. When the amplitude range of $V_{qN}$ in equation (2') is compared with that of $V_{qN32}$ in equation (26), the range of $V_{qN32}$ is decreased to $\frac{1}{2}$ the range of $V_{qN}$ for the two-bit quantizer resolution, although it is the same as that of $V_{qN}$ for the one-bit quantizer resolution. When the quantizer resolution is further increased, $V_{qN32}$ is further decreased.

The second-loop input signal $V_{IN32}$ is exemplified as indicated in equation (23). However, equation (22) can be approximated to be $V_{H31} = V_{IN} - V_{qN31}$ in a low frequency range. The quantization noise component in equation (22) is the same as that of equation (23), and the input signal component does not cause noise. Therefore, even if only the integrator output $V_{H31}$ serves as $V_{IN32}$, the same operation as described above can be performed. It is that $V_{H31}$ can be used as the quantization error in the first quantization loop.

An increase in S/N ratio in the embodiment of FIG. 15 will be described as compared with that of the conventional circuit.

Figure 20A:
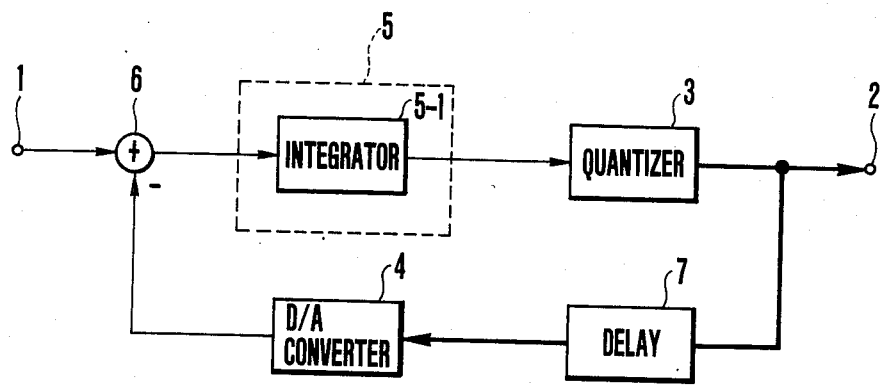
FIGS. 20A and 20B are block diagrams of conventional single integral type A/D and D/A converters, respectively.
Figure 20B:
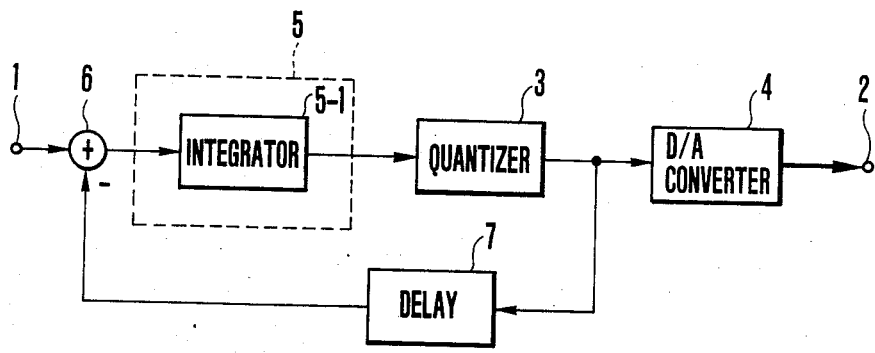

An S/N ratio of the circuit in FIG. 15 is calculated in the same manner as in the conventional circuits in FIGS. 20B, 21B so as to compare the S/N ratio of the embodiment in FIG. 15 and that of the conventional circuits.

If the transfer function $H_{31}$ of the integrator 113, the transfer function $H_{32}$ of the integrator 122, and the transfer function $1/H_{33}$ of the differentiator 125 are given as $H_{31} = H_{32} = H_{33} = 1/(1-Z^{-1})$ of the single integrator, the operation speed of the loop is mostly determined by the integrator requiring a multi-bit adder. Therefore, the loops in FIG. 15 can be simultaneously operated at the same sampling frequency $f_S$ as that of the conventional circuit in FIG. 20. The sampling frequency $f_S$ of the conventional circuit arrangement with two cascade-connected integrators in FIG. 21 is decreased to $\frac{1}{2}$ the sampling frequency $f_S$ of the single integral type circuit arrangement.

If $f_{BW} = 16$ kHz, $f_S = 2048$ kHz and the quantizer has a 2-bit resolution, an increase in S/N ratio by dispersion of quantization noise over a wide range is 18 dB, an increase in S/N ratio by noise shaping is 59 dB according to equation (26), and an increase in S/N ratio by $V_{qN32}$ being $\frac{1}{2}$ (equations (27) and (28)) is 6 dB. Therefore, a total increase in S/N ratio is 83 dB, and the S/N ratio is:

$$90.8 \text{ dB} = 6 \text{ dB} \times (2 \text{ bits} - 1) + 1.8 \text{ dB} + 83 \text{ dB}$$

Thus, a higher S/N ratio can be obtained by the embodiment described above as compared with that of the conventional circuit arrangement.

The S/N ratio is calculated by assuming that the D/A converters 116 and 126 generate accurate outputs. However, since the D/A converters 116 and 126 in FIG. 15 are analog circuits, output voltage precision is degraded by low element precision or the like.

The embodiment in FIG. 15 is constituted by the two loops, each of which includes an integrator and a quantizer. However, an oversampling converter may be constituted by two or more loops.

Figure 16:
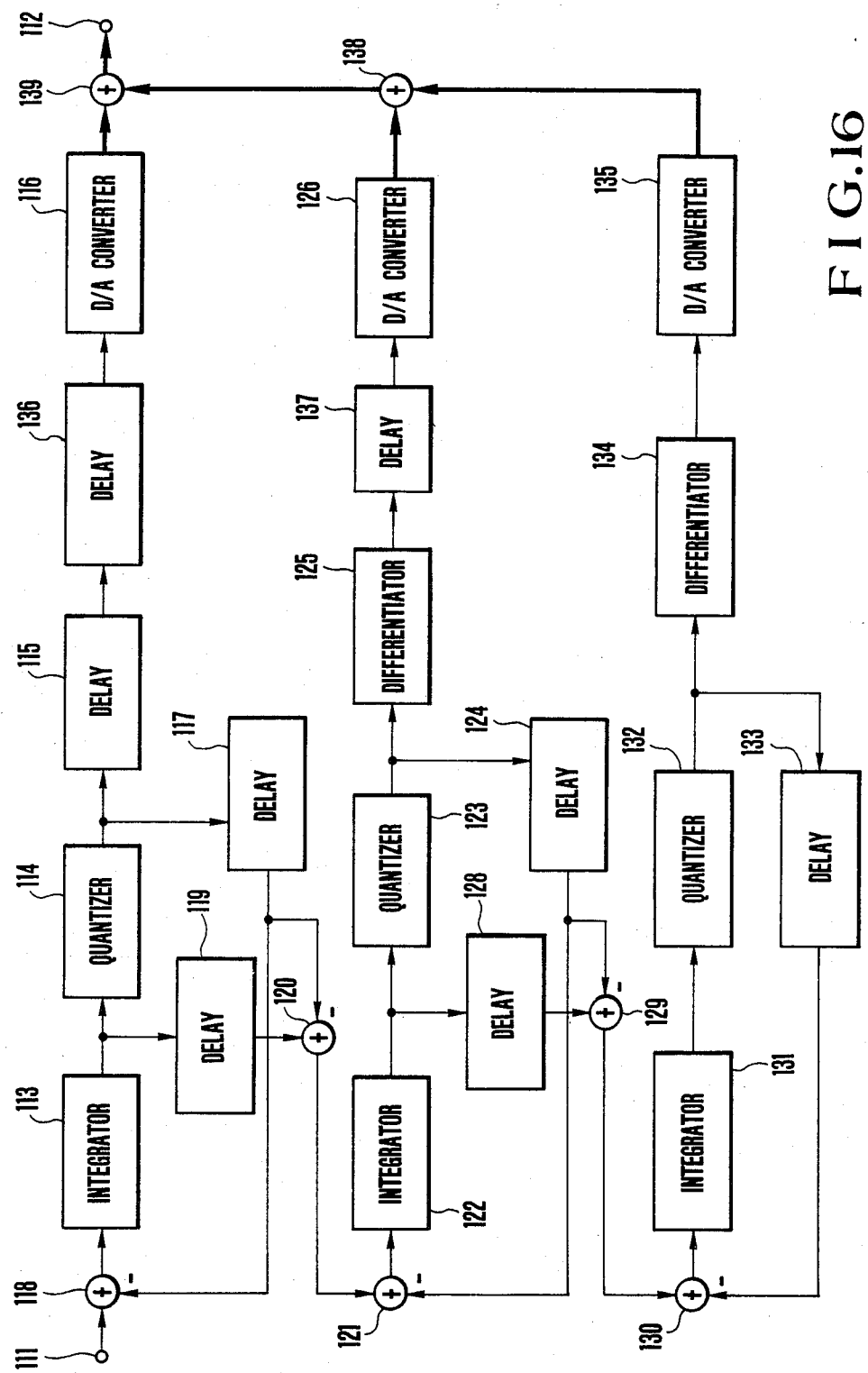
FIG. 16 is a block diagram of an oversampling D/A converter according to still another embodiment of the present invention.

FIG. 16 is a block diagram of still another embodiment of the present invention showing a circuit arrangement constituted by three loops.

The same reference numerals in FIG. 16 denote the same parts in FIG. 15. Referring to FIG. 16, reference numeral 128 denotes a delay circuit for receiving an output from an integrator 122; 129, an adder for adding an output from the delay circuit 128 and an output from a delay circuit 124; 130, an adder for adding an output from the adder 129 and an output from a delay circuit 133; 131, an integrator for receiving an output from the adder 130; 132, a quantizer for decreasing a resolution of a digital output from the integrator 131; 133, the delay circuit for receiving an output from the quantizer 132 and supplying a feedback signal to the adder 130; 134, a differentiator for differentiating an output from the quantizer 132; 135, a D/A converter for converting a digital signal from the differentiator 134 to an analog signal; 136 and 137, delay circuits inserted between a delay circuit 115 and a D/A converter 116 and between the differentiator 125 and a D/A converter 126, respectively; 138, an adder for adding an output from the D/A converter 126 and an output from the D/A converter 135; and 139, an adder for adding an output from the adder 138 and an output from the D/A converter 116, and supplying the sum signal to a signal output terminal 112.

In the embodiment shown in FIG. 16, a third loop constituted by the adder 130, the integrator 131, the quantizer 132, and the delay circuit 133 is added to the arrangement in FIG. 15.

The operation of the circuit having the arrangement in FIG. 16 will be described hereinafter.

A third-loop input $V_{IN33}$ has a waveform with a phase opposite to that of the quantization noise generated by the quantizer 123. The relationship between the second and third loops is the same as between the first and second loops in FIG. 15.

An output $V_{\bar{O}32}$ from the adder 138 is given in the same manner as in equation (25):

$$V_{\bar{O}32} = \{-V_{qN31} \cdot H_{32}/(1+Z^{-1} \cdot H_{32}) + V_{qN33}/(1 + Z^{-1} \cdot H_{34})H_{35}\}/H_{33} \quad (29)$$

wherein a transfer function of the differentiator 134 is given as $1/H_{35} \cdot H_{33}$.

An analog output signal $V_{A\bar{O}}$ appearing at the signal output terminal 112 is a sum of $V_{\bar{O}31}$ in equation (21) and $V_{\bar{O}32}$ in equation (29). If $H_{31} = H_{32} = H_{33} = H_{34} = H_{35}$, the analog output signal $V_{A\bar{O}}$ is calculated by equation (30) below:

$$V_{A\bar{O}} = - V_{IN} \cdot H_{31}/(1+Z^{-1} \cdot H_{31}) + V_{qN33}/(1+Z^{-1} \cdot H_{34}) \cdot H_{35} \cdot H_{33} \quad (30)$$

If the noise component in equation (30) is defined as $V_{TN}$ and the transfer functions $H_{31}$ to $H_{35}$ are defined as $1/(1-Z^{-1})$ as the transfer function of the single integrator, the noise component $V_{TN}$ is calculated by equation (31):

$$V_{TN} = V_{qN33} \cdot (1-Z^{-1})^3 \quad (31)$$

When the number of loops, each with an integrator and a quantizer, is increased from two to three, the expression for the noise component $V_{TN}$ is changed from the 2nd order noise shaping of equation (26) to the 3rd order noise shaping of equation (31). The number of loops can be increased to four or more in the same manner as in the case wherein the number of loops is increased from two to three.

Figure 17:
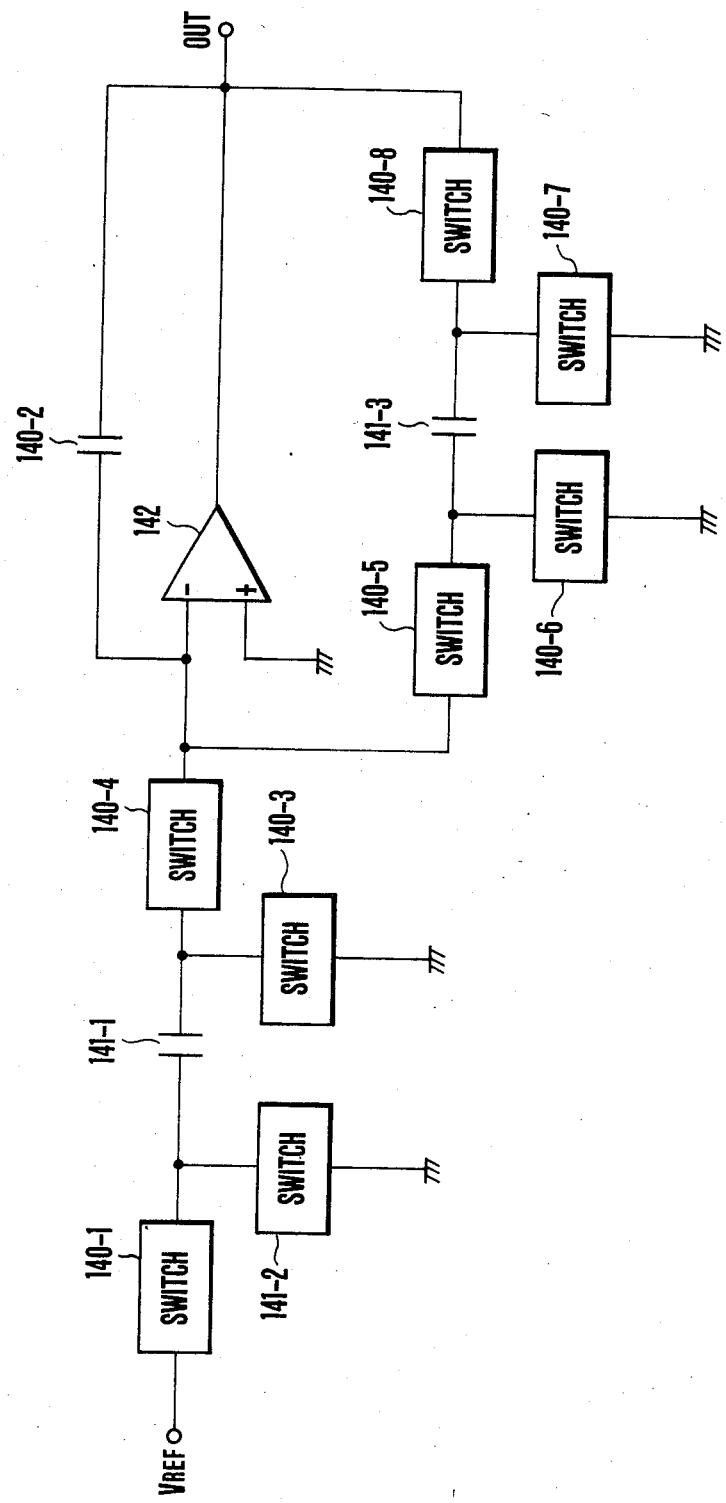
FIG. 17 is a circuit diagram showing the detailed arrangement of the D/A converters in FIGS. 15 and 16.

FIG. 17 shows a D/A converter which has a one- to two-bit resolution and which is constituted by a switched capacitor circuit.

Referring to FIG. 17, reference symbol $V_{REF}$ denotes an input terminal applied with a reference voltage; and OUT, an output terminal. Reference numerals 140-1 to 140-8 denote switch circuits (analog switches); 141-1 to 141-3, capacitor elements; and 142, an operational amplifier.

If capacitances of the capacitor elements 141-1 to 141-3 are given as $C_S$, $C_I$, and $C_B$, respectively, a transfer function $H_{DA}$ between the input terminal $V_{REF}$ and the output terminal OUT is given by equation (32):

$$H_{DA} = C_S/\{C_I - Z^{-1} \cdot (C_I - C_B)\} \quad (32)$$

$Z^{-1}$ is substantially 1 at a signal frequency bandwidth sufficiently lower than the sampling frequency $f_S$, so that a gain is given as $C_S/C_B$. The capacitor element 141-1 ($C_S$) is charged with the $V_{REF}$ voltage to produce an analog voltage by controlling the connection order of the switch circuits 140-1 to 140-4. In this case, three charging modes (i.e., positive, negative, and noncharge voltage modes) can be selected, so the converter of this embodiment serves as a D/A converter with a one- to two-bit resolution.

In this manner, a linearity problem does not occur in the D/A converter with one capacitor element. However, the gain, i.e., the absolute value of the output voltage, changes in accordance with a change in capacitive ratio $C_S/C_B$. Therefore, precision of gains of the D/A converters 116 and 126 in FIG. 15 presents a crucial problem. A ratio of the gain of the D/A converter 126 to that of the D/A converter 116 is given as $\alpha(\alpha \approx 1)$. In the same manner as in equation (26), a noise component $V_{TN}$ is calculated by equation (33) below:

$$V_{TN} = V_{qN31} \cdot (1-\alpha) \cdot (1-Z^{-1}) + V_{qN32} \cdot \alpha \cdot (1-Z^{-1})^2 \quad (33)$$

When capacitive ratio precision is 0.5 to 0.05% as described above, $\alpha = 0.995$ to 0.9995. The term $(1-\alpha)$ represents a value of 0.005 to 0.0005 ($-46$ to $-66$ dB). A gain of $(1-Z^{-1})$ at $f_S = 2048$ kHz and $f_{BW} = 16$ kHz is $-26$ dB, and the term $V_{qN31}$ has a level lower than $V_{qN32}$ by 20 dB or more. A decrease in S/N ratio by the term $V_{qN31}$ is as small as about 0.05 or less. For this reason, a high S/N ratio can be obtained without using high-precision elements.

The transfer function of the integrator need not be the same as that of the ideal integrator element. The design conditions of the integrator are:

(1) An integrator has a frequency transfer function such that a gain in a low frequency range, i.e., in a signal frequency range, is larger than that in a high frequency range;

(2) A loop including a quantizer and an integrator does not oscillate and is stably operated in response to an input signal; and (3) A differentiator has an inverted transfer function of that of the integrator.

The transfer functions ($H_1$, $H_2$, etc.) of the integrators of the respective loops must be identical, as described above. However, the S/N ratio within the signal band is not degraded even if the noise level is increased at a frequency band higher than the signal bandwidth. Therefore, the transfer functions need be identical only within the signal band. In order to decrease a high-frequency noise level excluding the signal bandwidth, the transfer functions are preferably identical throughout the entire band.

Figure 18:
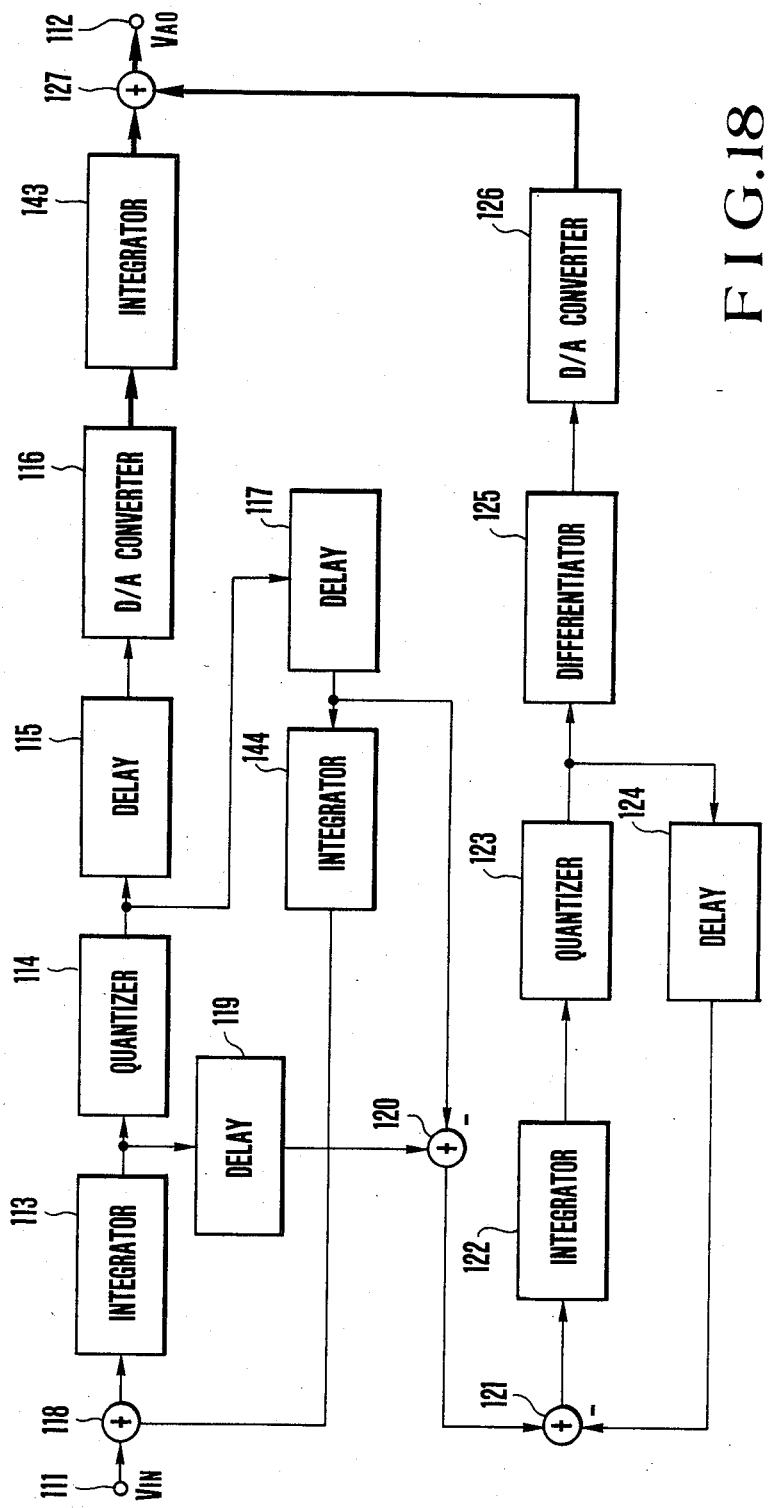
FIG. 18 is a block diagram of an oversampling D/A converter according to still another embodiment of the present invention.

FIG. 18 shows still another embodiment of the present invention. The embodiment in FIG. 18 is substantially the same as that in FIG. 15, except that integrators 143 and 144 are added to the arrangement in FIG. 15.

With this arrangement, since the output from the integrator 144 is compared with an input signal, the integrator 144 can be properly operated in response to the speed of the input signal because of its low-frequency gain even if an output value from a quantizer 114 is small. In other words, the quantization error generated by the quantizer 114 is decreased to obtain a high S/N ratio.

The analog output signal $V_{A\bar{O}}$ appearing at a signal output terminal 112 in the embodiment of FIG. 18 is given as equation (34) below. The transfer functions of the integrators 142 and 143 are given as $H_{36}$ and $H_{37}$, respectively, and other conditions are the same as those in FIG. 15.

$$V_{A\bar{O}} = V_{IN}\{H_{31} \cdot H_{37}/(1 + Z^{-1} \cdot H_{31} \cdot H_{36})\} + \quad (34)$$

$$V_{qN31}\{H_{37}/(1 + Z^{-1} \cdot H_{31} \cdot H_{36} - H_{32}/(1 + Z^{-1} \cdot H_{32})H_{33}\} +$$

$$V_{qN32}\{1/(1 + Z^{-1} \cdot H_{32})H_{33}\}$$

When the term $V_{qN31}$ in equation (34) is eliminated, the noise component is represented by only the term $V_{qN32}$ in the same manner as in equation (25). Furthermore, the frequency distribution characteristics in equation (34) are the same as those in equation (25). It should be noted that the term $V_{qN31}$ is eliminated in the low frequency range when conditions $H_{31}=H_{32}=H_{33}$ and $H_{36}=H_{37}$ are established. In order to completely eliminate the term $V_{qN31}$, the transfer functions $H_{31}$ to $H_{33}$, and $H_{36}$ and $H_{37}$ are given by equations (35) below:

$$\left.\begin{array}{l} H_{31} = H_{32} = H_{33} = 1/(1 - Z^{-1}) \\ H_{36} = (2 - Z^{-1})/(1 - Z^{-1}) \\ H_{37} = 1/(1 - Z^{-1}) \end{array}\right\} \quad (35)$$

Substitution of equations (35) into equation (34) yields equation (36):

$$V_{D\bar{O}} = V_{IN} + V_{qN32} \cdot (1 - Z^{-1})^2 \quad (36)$$

According to equation (36), the noise component is the same as those in equation (26) described with reference to FIG. 15.

As described above, $V_{qN32}$ in FIG. 18 is smaller than that in FIG. 15. For example, if $f_{BW}=16$ kHz and $f_S=2048$ kHz, a gain of $H_{36}$ is about 26 dB, so that $V_{qN32}$ in the embodiment shown in FIG. 18 can be lower than that in the embodiment of FIG. 15 by 26 dB.

Figure 19:
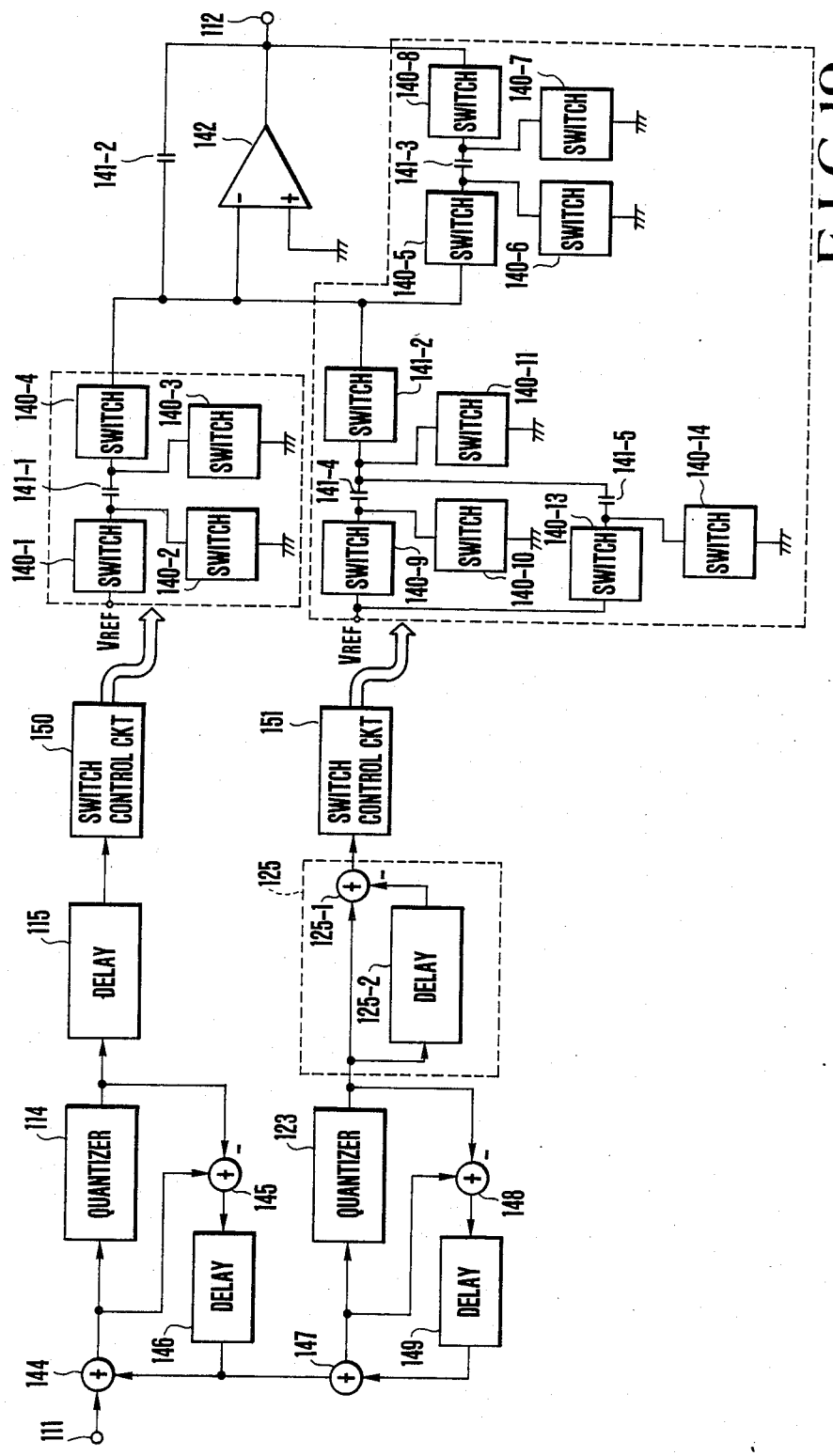
FIG. 19 is a block diagram showing the detailed arrangement of the D/A converter in FIG. 18.

FIG. 19 is a circuit diagram when the integrator network is constituted by a single integrating element ($H_{31}=H_{32}=H_{33}=1/(1-Z^{-1})$) in the arrangement of FIG. 15. The same reference numerals in FIG. 19 denote the same parts as in FIG. 15, and a detailed description thereof will be omitted.

A D/A converter in FIG. 19 is obtained by applying the circuit of FIG. 15. An operational amplifier 142, capacitor elements 141-2 and 141-3, and switch circuits 140-5 to 140-8 are commonly used in D/A converters 116 and 126 as in FIG. 15. A charge circuit for the D/A converter 116 is constituted by the capacitor element 141-1 and switch circuits 140-1 to 140-4. A charge circuit for the D/A converter 126 is constituted by the capacitor elements 141-4 and 141-5 and the switch circuits 140-9 to 140-14. In this manner, independent charge circuits are provided for D/A converters 116 and 126, respectively.

Quantizers 114 and 123 have a two-bit resolution each. A quantized voltage from the quantizer 114 represents three values (i.e., 0 and $\pm V_{REF}$). A quantized voltage from the quantizer 123 represents three values (i.e., 0 and $\pm V_{REF}/2$).

A differentiator 125 is constituted by a delay circuit (register) 125-2 and an adder 125-1, and has a transfer function of $1/H_{33}=(1-Z^{-1})$. An output from the differentiator 125 represents one of the quantized voltage levels 0, $\pm V_{REF}/2$, and $\pm V_{REF}$, so that charging of the capacitor elements 141-4 and 141-5 is controlled by a switch control circuit 151 when capacitances thereof are set to be ½ of that of the capacitor element 141-1. Charging of the capacitor element 141-1 is controlled by a switch control circuit 150. Each of integrators 113 and 122 in FIG. 15 is constituted by a register and an adder. When the integrators 113 and 122 have transfer functions $H_{31}=H_{32}=1/(1-Z^{-1})$, the adders 118, 120, and 121 and the delay circuits (registers) 115, 117, 119, and 124 are grouped, the circuit can be simplified, as shown in FIG. 19.

The frequency spectrum distribution characteristics of the analog signal output in FIG. 15 are substantially the same as those in FIG. 6. In this case, $f_S=2048$ kHz, 0 dB=sinusoidal wave with a peak value of $V_{REF}$, and the spectrum width=500 Hz. According to these characteristics, the noise level in the low frequency range is found to be greatly decreased.

The S/N characteristics of the embodiment in FIG. 15 are substantially the same as those in FIG. 7. FIG. 7 exemplifies a case for $f_S=2048$ kHz and $f_{BW}=16$ kHz. In this graph, the input signal amplitude level is plotted along the abscissa, and the S/N ratio is plotted along the ordinate.

As is apparent from the S/N characteristics in FIG. 7, the S/N ratio is linearly changed as a function of the input signal amplitude level. These characteristics are substantially the same as those in a linear 15-bit A/D converter. The S/N ratio calculated by the previously mentioned equations is 90.8 dB, which substantially coincides with the S/N ratio at the 0-dB input level in FIG. 7.

According to the embodiments shown in FIGS. 15 to 19, in the same manner as in the A/D converters previously described, a plurality of quantization loops are used to perform multi-stage quantization to greatly decrease the noise level in a low frequency bandwidth. Therefore, a very high S/N ratio in the signal frequency bandwidth sufficiently lower than the sampling frequency $f_S$ can be obtained. Furthermore, since the plurality of loops are simultaneously operated, high-speed processing can be performed, and a high sampling frequency $f_S$ can be obtained. A high sampling frequency $f_S$ further increases the S/N ratio. The high S/N ratio can be obtained even if a low 1- to 2-bit D/A converter resolution, for achieving better linearity independently of element precision, is employed. At the same time, specific precision of the plurality of D/A converters can be easily obtained in the IC basis. As a result, post-processing such as fine adjustments after circuit fabrication need not be performed, resulting in low cost and other advantages.

As is apparent from the embodiment in FIG. 15, although the analog circuit size is small, a relatively large number of digital circuits are used in the quantization loops. However, along with advances of IC micropatterning, the integration density of digital circuits is larger than that of analog circuits. Because of this, a digital circuit arrangement decreases the chip size and the present invention is thus suitable for integration circuits. As a result, a compact D/A converter of high precision can be fabricated at low cost.

The oversampling D/A converters of the present invention have many unique advantages over those of the conventional D/A converter in that conversion operation can be performed at a frequency much higher than the signal frequency.

The present invention is not limited to the particular embodiments described above. Various changes and modifications may be made within the spirit and scope of the invention. For example, in the embodiment in FIG. 2, the output from the third-loop differentiator 37 is supplied to the input side of the differentiator 26. However, the output from the differentiator 37 can be supplied to the adder 39 through another differentiator.

What is claimed is:

1. An oversampling converter with sampling frequency sufficiently higher than an input signal frequency, comprising: N quantization loops (N is an integer of not less than 2), each having an integrator for integrating a difference between an input terminal signal and a feedback signal, a quantizer for quantizing an output from said integrator, means for converting an output from said quantizer to the feedback signal, means for detecting a quantization error generated by said quantizer, and means for converting the output from said quantizer to a loop output signal;
    a first quantization loop for producing a first loop output signal from the input terminal signal;
    an nth quantization loop (n is an integer between 2 and N), having the same arrangement as said first quantization loop, for receiving at input terminals a quantization error from an (n−1)th quantization loop and for producing an nth output signal; and
    multiplying and adding means for adding the signal obtained by multiplying the nth loop output signal with a transfer function of a reciprocal number of a product of transfer functions of said integrators included in said first to (n−1)th quantization loop, to said first loop output signal, and for generating a sum signal, the sum signal appearing as an output signal.

2. A converter according to claim 1, wherein said feedback signal producing means in each loop includes an integrator for amplifying only a low-frequency signal component, and said loop output signal producing means in each loop includes the same type integrator as in said said feedback signal producing means in each loop.

3. A converter according to claim 1, wherein there is provided means for adding an output from said quantization error detecting means in said nth quantization loop to an output from said integrator in said (n−1)th quantization loop and for supplying a sum signal to said quantizer in said (n−1)th quantization loop.

4. A converter according to claim 1, wherein said quantization error detecting means calculates as the quantization error a difference between an output from said integrator and an output from said quantizer in each loop.

5. A converter according to claim 1, wherein said quantization error detecting means calculates as the quantization error an output from said integrator in each loop.

6. A converter according to claim 1, wherein said feedback producing means has a D/A conversion function for converting an analog input signal to a digital signal and generating the digital signal.

7. A converter according to claim 1, wherein said multiplying and adding means supplies the output signal from said nth quantization loop to a differentiator with a transfer function as a reciprocal number of a product of the transfer functions of said integrators included in said first to (n−1)th quantization loops, and adds the nth output signal from said differentiator to the output signal from said first quantization loop.

8. A converter according to claim 7, wherein each differentiator is connected to a D/A converter to convert a digital input signal to an analog signal and generating the analog signal.

9. A converter according to claim 1, wherein said multiplying and adding means sequentially supplies the output signals of said nth quantization loop to differentiators with transfer functions of reciprocal numbers of the transfer functions of said integrators included in said first to (n−1)th quantization loops, and adds the obtained nth output signal to the output signal from said first quantization loop.

10. A converter according to claim 9, wherein each differentiator is connected to D/A converter to convert a digital input signal to an analog signal and generating the analog signal.

11. A converter according to claim 1, wherein said multiplying and adding means supplies the output signals from said nth quantization loop to a differentiator with a transfer function as a reciprocal number as the transfer function of said integrator included in said (n−1)th quantization loop and then adds an output from said differentiator to said (n−1)th loop output signal.

12. A converter according to claim 11, wherein each differentiator is connected to a D/A converter to convert a digital input signal to an analog signal and generating the analog signal.

* * * * *